(12) United States Patent
Kuiper et al.

(10) Patent No.: US 9,575,418 B2
(45) Date of Patent: Feb. 21, 2017

(54) APPARATUS FOR TRANSFERRING A SUBSTRATE IN A LITHOGRAPHY SYSTEM

(71) Applicant: Mapper Lithography IP B.V., Delft (NL)

(72) Inventors: Vincent Sylvester Kuiper, The Hague (NL); Erwin Slot, Zoetermeer (NL); Marcel Nicolaas Jacobus Van Kervinck, The Hague (NL); Guido De Boer, Leerdam (NL); Hendrik Jan De Jong, The Hague (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 0 days.

(21) Appl. No.: 14/850,997

(22) Filed: Sep. 11, 2015

(65) Prior Publication Data
US 2016/0004173 A1 Jan. 7, 2016

Related U.S. Application Data

(63) Continuation of application No. 13/460,239, filed on Apr. 30, 2012, now Pat. No. 9,176,397.
(Continued)

(51) Int. Cl.
*G03B 27/60* (2006.01)
*G03B 27/58* (2006.01)
(Continued)

(52) U.S. Cl.
CPC ........ *G03F 7/70733* (2013.01); *G03F 7/7075* (2013.01); *H01L 21/67178* (2013.01); *H01L 21/67225* (2013.01); *H01L 21/67745* (2013.01)

(58) Field of Classification Search
CPC .......................... G03F 7/70733; G03F 7/7075
(Continued)

(56) References Cited

U.S. PATENT DOCUMENTS

| 4,951,601 A | 8/1990 | Maydan et al. |
| 5,536,128 A | 7/1996 | Shimoyashiro et al. |

(Continued)

FOREIGN PATENT DOCUMENTS

| EP | 1109203 A2 | 6/2001 |
| EP | 1457829 A1 | 9/2004 |

(Continued)

*Primary Examiner* — Hung Henry Nguyen
(74) *Attorney, Agent, or Firm* — Hoyng Monegier LLP; David P. Owen

(57) ABSTRACT

An apparatus for transferring a target, such as a substrate or a substrate support structure onto which a substrate has been clamped, from a substrate transfer system to a vacuum chamber of a lithography system. The apparatus comprises a load lock chamber for transferring the target into and out of the vacuum chamber. The load lock chamber comprises a first wall with a first passage providing access between a robot space and the interior of the load lock chamber, a second wall with a second passage providing access between the interior of the load lock chamber and the vacuum chamber, and plurality of handling robots for transferring the targets comprising: a first handling robot movable within the robot space to access the substrate transfer system and the first passage; and a second handling robot movable within the load lock chamber to access the first passage and the second passage.

22 Claims, 12 Drawing Sheets

Related U.S. Application Data

(60) Provisional application No. 61/480,163, filed on Apr. 28, 2011.

(51) Int. Cl.
  *G03F 7/20* (2006.01)
  *H01L 21/67* (2006.01)
  *H01L 21/677* (2006.01)

(58) Field of Classification Search
  USPC ........ 355/53, 72–77; 118/500, 719; 414/783
  See application file for complete search history.

(56) References Cited

U.S. PATENT DOCUMENTS

| | | | |
|---|---|---|---|
| 5,651,823 A * | 7/1997 | Parodi | G03F 7/30 118/500 |
| 6,364,762 B1 | 4/2002 | Kaveh et al. | |
| 6,897,458 B2 | 5/2005 | Wieland et al. | |
| 6,958,804 B2 | 10/2005 | Wieland et al. | |
| 7,019,908 B2 | 3/2006 | van 't Spijker | |
| 7,084,414 B2 | 8/2006 | Wieland et al. | |
| 7,129,502 B2 | 10/2006 | Kruit | |
| 8,089,056 B2 | 1/2012 | Wieland et al. | |
| 8,198,602 B2 | 6/2012 | Steenbrin | |
| 2002/0050244 A1 | 5/2002 | Engesser | |
| 2002/0067585 A1 | 6/2002 | Fujiwara | |
| 2003/0021671 A1 | 1/2003 | Edo | |
| 2003/0073309 A1 | 4/2003 | Emami | |
| 2004/0191028 A1 | 9/2004 | Tamai | |
| 2004/0234359 A1 | 11/2004 | Mitchell et al. | |
| 2004/0247417 A1 | 12/2004 | Fujimura et al. | |
| 2005/0026448 A1 | 2/2005 | Engesser | |
| 2005/0259236 A1 | 11/2005 | Straaijer | |
| 2005/0264791 A1 | 12/2005 | Del Puerto et al. | |
| 2007/0002516 A1 | 1/2007 | Matsumoto | |
| 2007/0064213 A1 | 3/2007 | Jager et al. | |
| 2007/0065144 A1 | 3/2007 | Hofmeister et al. | |
| 2007/0084561 A1 | 4/2007 | Engesser | |
| 2007/0114440 A1 | 5/2007 | Yang | |
| 2008/0024743 A1 | 1/2008 | Kruit et al. | |
| 2008/0225261 A1 | 9/2008 | Hirayanagi | |
| 2008/0286491 A1 | 11/2008 | Takahashi et al. | |
| 2008/0286947 A1 | 11/2008 | Coenen et al. | |
| 2009/0212229 A1 | 8/2009 | Wieland et al. | |
| 2009/0255362 A1 | 10/2009 | Barker et al. | |
| 2009/0261267 A1 | 10/2009 | Wieland et al. | |
| 2010/0129182 A1 | 5/2010 | Ishida | |
| 2010/0150687 A1 | 6/2010 | Sakata et al. | |
| 2010/0236476 A1 * | 9/2010 | De Jong | B82Y 10/00 118/620 |
| 2010/0238421 A1 | 9/2010 | De Jong | |
| 2010/0265486 A1 | 10/2010 | De Jong et al. | |
| 2011/0073782 A1 | 3/2011 | Wieland | |
| 2011/0079730 A1 | 4/2011 | Wieland | |
| 2011/0216299 A1 | 9/2011 | Steenbrink | |
| 2014/0202921 A1 | 7/2014 | Babbs et al. | |

FOREIGN PATENT DOCUMENTS

| | | |
|---|---|---|
| EP | 1860684 A1 | 11/2007 |
| JP | 07-029787 | 1/1995 |
| JP | 11121362 A2 | 4/1999 |
| JP | 2006 066690 A | 3/2006 |
| WO | WO 96 20583 A1 | 7/1996 |
| WO | WO 02 23597 A2 | 3/2002 |
| WO | WO 03 008157 A2 | 1/2003 |
| WO | WO 2004 021411 A2 | 3/2004 |
| WO | WO 2005 113853 A1 | 12/2005 |
| WO | WO 2008 144668 A1 | 11/2008 |
| WO | WO 2009 011574 A1 | 12/2008 |
| WO | 2009/127658 A1 | 10/2009 |
| WO | WO 2009 127658 A1 | 10/2009 |

* cited by examiner

APPARATUS FOR TRANSFERRING A SUBSTRATE IN A LITHOGRAPHY SYSTEM

CROSS REFERENCE TO RELATED APPLICATIONS

This application is a continuation of U.S. patent application Ser. No. 13/460,239 filed on 30 Apr. 2012, now U.S. Pat. No. 9,176,397, which claims priority from U.S. provisional application No. 61/480,163 filed on 28 Apr. 2011. All abovementioned applications are hereby incorporated by reference in their entireties.

FIELD OF THE INVENTION

The present invention relates to an apparatus for transferring substrates within a lithography machine using handling robots.

DESCRIPTION OF THE RELATED ART

In the semiconductor industry, an ever increasing desire to manufacture smaller structures with high accuracy and reliability puts great demands on wafer processing technology. In particular, it is important to maximize wafer throughput of wafer processing equipment while maintaining the lowest capital costs and operational costs, and without excessive use of floor space. Floor space in a semiconductor manufacturing environment is expensive, as most space needs to meet high standard clean room conditions. Therefore, the floor space that is to be occupied by wafer processing equipment, i.e. the so-called footprint, is preferably as limited as possible. Furthermore, to ensure that clean room conditions can be maintained, wafer processing equipment is preferably serviced within the clean room.

A very critical step in the manufacturing of integrated circuits on a wafer is lithography. In a lithography process, a predetermined pattern is transferred onto a semiconductor substrate, often referred to as a wafer. Currently, the smallest dimensions of structures patterned with a lithography apparatus are about 70 nm in size. However, to produce even more complex circuits, structures of smaller size are desired.

The throughput of lithography systems is also a critical factor. Charged particle lithography machines are capable of patterning substrates at extremely small dimensions, but at a lower throughput. Currently, optical lithography machines are available which can pattern about 100 wafers per hour. A cluster of 10 charged particle lithography machines, each capable of patterning about 10 wafers per hour, can match this throughput.

The efficient delivery of substrates to be exposed to each lithography machine and retrieval of exposed substrates from each lithography machine is a critical factor in maximizing throughput of the system as a whole.

BRIEF SUMMARY OF THE INVENTION

The invention to provides according to one aspect, an apparatus for transferring substrates within a lithography system, the lithography system comprising an interface with a substrate supply system for receiving unclamped substrates and a substrate preparation unit for clamping an unclamped substrate onto a substrate support structure to form a clamped substrate. The apparatus comprises a body provided with a first set of fingers for carrying an unclamped substrate and a second set of fingers for carrying a clamped substrate (i.e. a substrate and substrate support structure clamped together). The first set of fingers is located below the second set of fingers, and fingers of the first set of fingers have a different shape than the fingers of the second set of fingers.

The fingers of the first and second sets of fingers may both extend from the body in the same direction. The fingers of the first set of fingers may be arranged sufficiently below the fingers of the second set of fingers so that the fingers of the first set of fingers do not interfere with a substrate support structure carried by the second set of fingers. The apparatus for transferring substrates is thus arranged for transferring both unclamped substrates which are smaller and lighter and clamped substrates which are larger and heavier (due to the clamped substrate including both the substrate and substrate support structure).

The fingers of the first set of fingers may take the form of straight, substantially parallel bars, with a length extending from the body that exceeds the radius of the unclamped substrate. The fingers of the first set of fingers may be separated by a distance less than the diameter of the unclamped substrate to provide a stable platform to securely lift the unclamped substrate. The fingers of the second set of fingers may take the form of opposing crescent structures with a length extending from the body that exceeds the radius of the substrate support structure. The fingers of the second set of fingers may be arranged to surround, at least partially, the substrate support structure, and may be arranged to engage and hold the substrate support structure at two or more points around its circumference. The body may be mounted on a robot arm comprising a base moveable in a substantially vertical direction, and one or more sections for movement in a substantially horizontal plane. The base may move upwards and downwards on a vertical rail. The sections may take the form of jointed arms, the robot arm comprising two jointed arms which may swivel about an axis and extend in a horizontal direction. The apparatus for transferring substrates may be thus arranged for transferring both unclamped and clamped substrates between locations at different heights, e.g. between an interface, a substrate preparation unit, and a load lock disposed in a vertical stacked arrangement. The base may be arranged for vertical movement within a robot space, and the robot arm may be arranged for transferring both unclamped and clamped substrates horizontally between the locations at different heights and the robot space to transfer the substrates between the different locations.

The substrate transfer apparatus may further comprise a horizontal transfer apparatus arranged for transferring unclamped substrates to and from the interface. The interface may comprise three or more pins, the pins arranged for vertical movement to lift an unclamped substrate from a first position accessible by the first set of fingers of the substrate transfer apparatus to a second position accessible by the horizontal transfer apparatus.

According to another aspect the invention provides a load lock transfer apparatus for transferring structures onto which substrates have been clamped within a load lock system in a lithography system unit. The apparatus comprises a body provided with at least two fingers for carrying the substrate supporting structure, and the fingers are located at different height levels. The fingers may take the form of opposing crescent structures with a length extending from the body that exceeds the radius of the substrate support structure. The fingers may be arranged to surround, at least partially, the substrate support structure.

Another aspect the invention relates to a lithography system comprising a lithography apparatus arranged in a vacuum chamber for patterning a substrate, a load lock system for transferring substrates into and out of the vacuum chamber, a substrate preparation unit for clamping a substrate onto a substrate support structure to form a clamped substrate, an interface with a substrate supply system for receiving unclamped substrates, and a substrate transfer apparatus for transferring substrates within the lithography system as described above. The load lock system may be provided with a load lock transfer apparatus for transferring structures onto which substrates have been clamped as described above, the load lock transfer apparatus arranged for receiving substrate support structures from the substrate transfer apparatus and placing the substrate support structures into the lithography apparatus, and for removing substrate support structures from the lithography apparatus and giving the substrate support structures to the substrate transfer apparatus.

Another aspect the invention relates to a substrate support structure for carrying a substrate for use in a lithography system, the substrate support structure comprising a body provided with a surface for accommodating the substrate, and two protrusions (which may be in the form of lips) positioned along the circumference of the substrate support structure, wherein the protrusions are located at a first height level above the center of mass of the substrate support structure. The first height level may be above the center of mass of the combination of the substrate support structure and a substrate clamped thereon. The two protrusions may be located along one side of the substrate support structure. The substrate support structure may further comprise a further protrusion located at the other, opposing, side of the substrate support structure. This arrangement allows the fingers of the apparatus for transferring substrates to engage with the protrusions, thus engaging the substrate support structure at three points around its circumference to carry it securely.

The structure may further comprises three additional protrusions, wherein two of the additional protrusions are provided at the first height level between the two protrusions located along the one side of the substrate support structure, and the third protrusion of the additional protrusions may be provided at the other, opposing, side of the substrate support structure at a second height level, the second height level being lower than the first height level. This arrangement allows the substrate support structure to be carried by the apparatus for transferring substrates with fingers at different heights, an upper finger arranged to engage with the protrusions at the first height level and a lower finger arranged to engage with the third protrusion at the second height level. By having the protrusions at different heights and a transfer apparatus with fingers at different heights which match the height difference of the protrusions, the substrate support structure may be carried securely while facilitating hand-off of the substrate support structure.

Another aspect the invention relates to a method for handing over a substrate support structure provided with a substrate on a surface thereof. The substrate support structure comprises a body provided with a surface for accommodating the substrate; two or more first protrusions positioned around the circumference of the substrate support structure, at least one of the first protrusions being positioned at a first height level above the center of mass of the substrate support structure; and two or more second protrusions positioned around the circumference of the substrate support structure, at least one of the second protrusions being positioned at a first height level above the center of mass of the substrate support structure and at least one of the second protrusions being positioned at a second height level lower than the first height level. The method comprises picking up the substrate support structure with a substrate transfer apparatus as described above, so that the fingers of the second set of fingers engage with the first protrusions; moving the substrate support structure towards a load lock transfer apparatus as described above; moving the substrate transfer apparatus or the load lock transfer apparatus so that the fingers of the load lock transfer apparatus engage with the second protrusions; and moving the substrate transfer apparatus or the load lock transfer apparatus so that the fingers of the substrate transfer apparatus disengage from the first protrusions; and retracting the substrate transfer apparatus so that the substrate support structure is carried by the load lock transfer apparatus.

The step of moving the substrate transfer apparatus or the load lock transfer apparatus so that the fingers of the load lock transfer apparatus engage with the second protrusions comprises moving the substrate transfer apparatus or the load lock transfer apparatus so that at least one of the fingers of the substrate transfer apparatus and at least one of the fingers of the load lock transfer apparatus overlap each other at different heights around the circumference of the substrate support structure.

It will be evident that the presently invented principle may be set into practice in various manners.

BRIEF DESCRIPTION OF THE DRAWINGS

Various aspects of the invention will be further explained with reference to embodiments shown in the drawings wherein:

FIG. 3b schematically shows a cross-sectional side view of a portion of the lithography system of FIG. 3a;

FIG. 3c schematically shows a side view of another portion of the lithography system of FIG. 3a;

FIG. 13b shows a more detailed view of the load lock system depicted in FIG. 13a;

DESCRIPTION OF ILLUSTRATIVE EMBODIMENTS

The following is a description of various embodiments of the invention, given by way of example only and with reference to the drawings.

Figure 1:
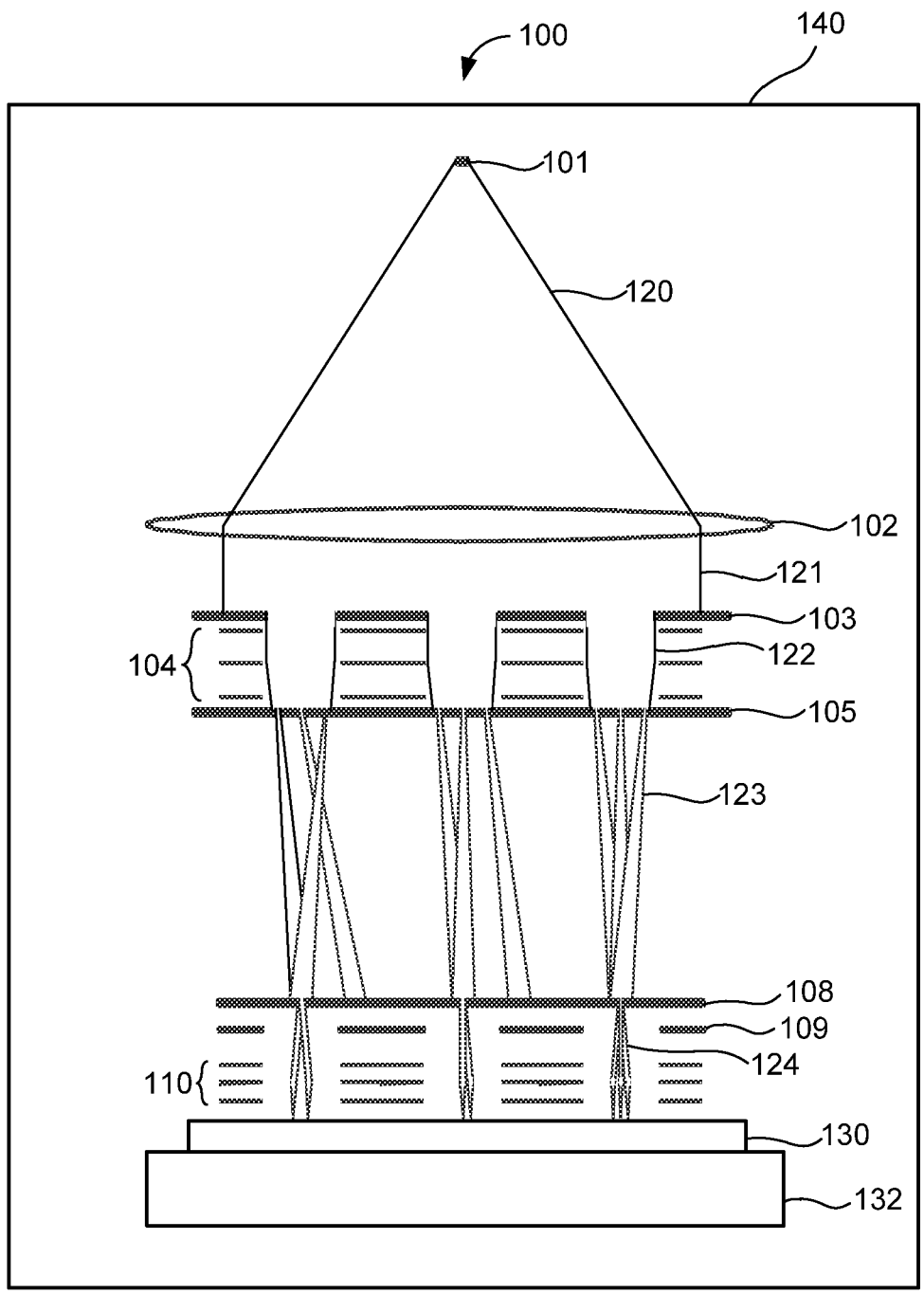
FIG. 1 is a simplified schematic drawing of an embodiment of a charged particle lithography apparatus.

FIG. 1 shows a simplified schematic drawing of an embodiment of a charged particle lithography apparatus 100. Such lithography systems are described for example in U.S. Pat. Nos. 6,897,458 and 6,958,804 and 7,019,908 and 7,084,414 and 7,129,502, U.S. patent application publication no. 2007/0064213, and co-pending U.S. patent application Ser. Nos. 61/031,573 and 61/031,594 and 61/045,243 and 61/055,839 and 61/058,596 and 61/101,682, which are all assigned to the owner of the present invention and are all hereby incorporated by reference in their entirety.

In the embodiment shown in FIG. 1, the lithography apparatus 100 comprises an electron source 101 for producing an expanding electron beam 120. The expanding electron beam 120 is collimated by collimator lens system 102. The collimated electron beam 121 impinges on an aperture array 103, which blocks part of the beam to create a plurality of beamlets 122. The system generates a large number of beamlets 122, preferably about 10,000 to 1,000,000 beamlets.

The electron beamlets 122 pass through a condenser lens array 104 which focuses the electron beamlets 122 in the plane of a beam blanker array 105, comprising a plurality of blankers for deflecting one or more of the electron beamlets. The deflected and undeflected electron beamlets 123 arrive at beam stop array 108, which has a plurality of apertures. The beamlet blanker array 105 and beam stop array 108 operate together to block or let pass the beamlets 123. If beamlet blanker array 105 deflects a beamlet, it will not pass through the corresponding aperture in beam stop array 108, but instead will be blocked. But if beamlet blanker array 105 does not deflect a beamlet, then it will pass through the corresponding aperture in beam stop array 108, and through beam deflector array 109 and projection lens arrays 110.

Beam deflector array 109 provides for deflection of each beamlet 124 in the X and/or Y direction, substantially perpendicular to the direction of the undeflected beamlets, to scan the beamlets across the surface of target or substrate 130. Next, the beamlets 124 pass through projection lens arrays 110 and are projected onto substrate 130. The projection lens arrangement preferably provides a demagnification of about 100 to 500 times. The beamlets 124 impinge on the surface of substrate 130 positioned on moveable stage 132 for carrying the substrate. For lithography applications, the substrate usually comprises a wafer provided with a charged-particle sensitive layer or resist layer.

The charged particle lithography apparatus 100 operates in a vacuum environment. A vacuum is desired to remove particles which may be ionized by the charged particle beams and become attracted to the source, may dissociate and be deposited onto the machine components, and may disperse the charged particle beams. A vacuum of at least $10^{-6}$ bar is typically required. In order to maintain the vacuum environment, the charged particle lithography system is located in a vacuum chamber 140. All of the major elements of the lithography apparatus 100 are preferably housed in a common vacuum chamber, including the charged particle source, projector system for projecting the beamlets onto the substrate, and the moveable stage.

In an embodiment the charged particle source environment is differentially pumped to a considerably higher vacuum of up to $10^{-10}$ mbar. In such embodiment, the source may be located in a separate chamber, i.e. a source chamber. Pumping down the pressure level in the source chamber may be performed in the following way. First, the vacuum chamber and the source chamber are pumped down to the level of the vacuum chamber. Then the source chamber is additionally pumped to a desired lower pressure, preferably by means of a chemical getter in a manner known by a skilled person. By using a regenerative, chemical and so-called passive pump like a getter, the pressure level within the source chamber can be brought to a lower level than the pressure level in the vacuum chamber without the need of a vacuum turbo pump for this purpose. The use of a getter avoids the interior or immediate outside vicinity of the vacuum chamber being submitted to acoustical and/or mechanical vibrations as would be the case if a vacuum turbo pump or similar would be used for such a purpose.

Figure 2:
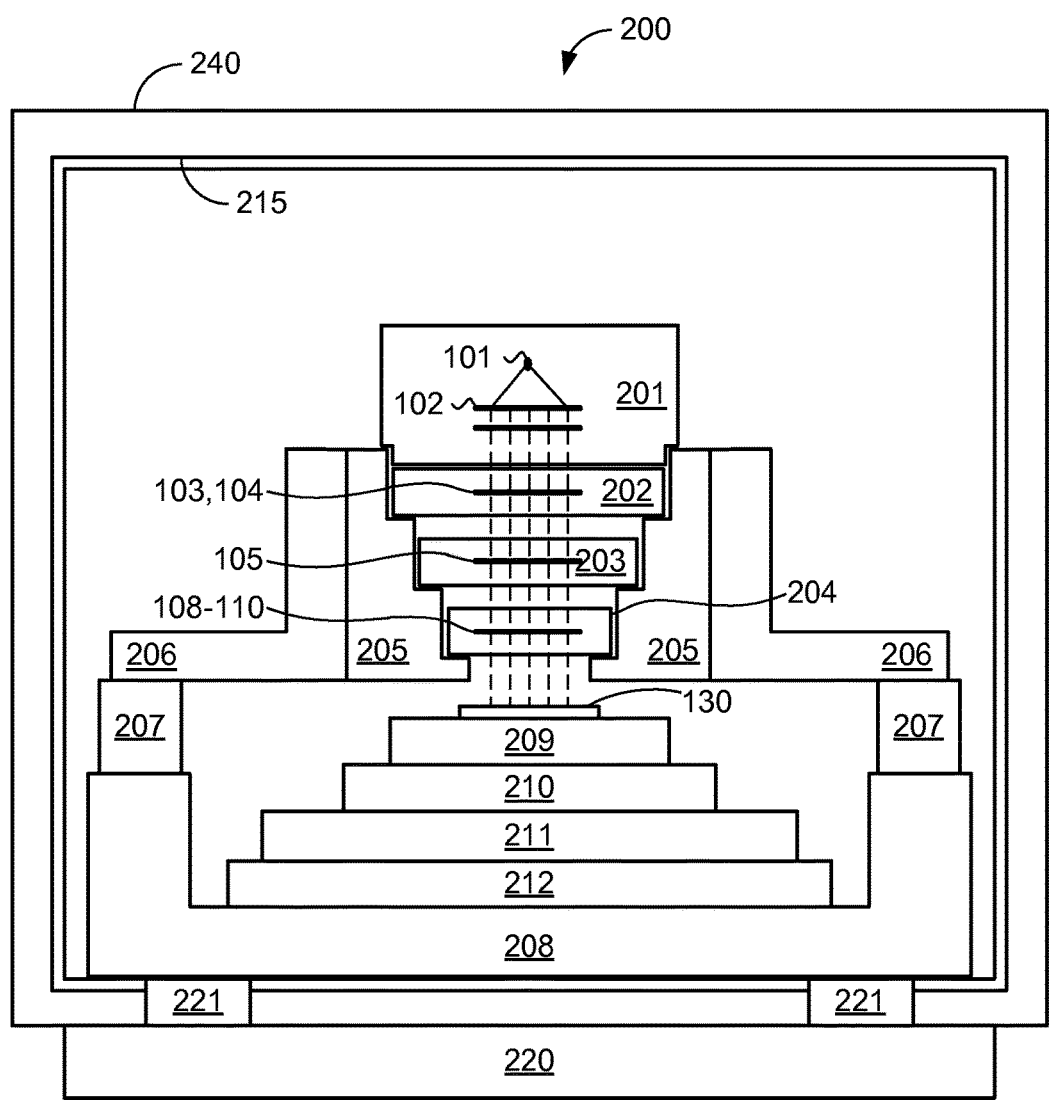
FIG. 2 is a simplified block diagram of a modular lithography apparatus.

FIG. 2 shows a simplified block diagram illustrating the principal elements of a modular lithography apparatus 200. The lithography apparatus 200 is preferably designed in a modular fashion to permit ease of maintenance. Major subsystems are preferably constructed in self-contained and removable modules, so that they can be removed from the lithography apparatus with as little disturbance to other subsystems as possible. This is particularly advantageous for a lithography machine enclosed in a vacuum chamber, where access to the machine is limited. Thus, a faulty subsystem can be removed and replaced quickly, without unnecessarily disconnecting or disturbing other systems.

In the embodiment shown in FIG. 2, these modular subsystems include an illumination optics module 201 including the charged particle beam source 101 and beam collimating system 102, an aperture array and condenser lens module 202 including aperture array 103 and condenser lens array 104, a beam switching module 203 including beamlet blanker array 105, and projection optics module 204 including beam stop array 108, beam deflector array 109, and projection lens arrays 110. The modules are designed to slide in and out from an alignment frame. In the embodiment shown in FIG. 2, the alignment frame comprises an alignment inner subframe 205 and an alignment outer subframe 206. A frame 208 supports the alignment subframes 205 and 206 via vibration damping mounts 207. The substrate 130 rests on substrate support structure 209, which is in turn placed on a chuck 210. The chuck 210 sits on the stage short stroke 211 and long stroke 212. The lithography machine is enclosed in vacuum chamber 240, which may include a mu metal shielding layer or layers 215. The machine rests on base plate 220 supported by frame members 221.

Each module requires a large number of electrical signals and/or optical signals, and electrical power for its operation. The modules inside the vacuum chamber 240 receive these signals from control systems which are typically located outside of the chamber 240. The vacuum chamber 240 includes openings, referred to as ports, for admitting cables carrying the signals from the control systems into the vacuum housing while maintaining a vacuum seal around the cables. Each module preferably has its collection of electrical, optical, and/or power cabling connections routed through one or more ports dedicated to that module. This enables the cables for a particular module to be disconnected, removed, and replaced without disturbing cables for any of the other modules.

Figure 3A:
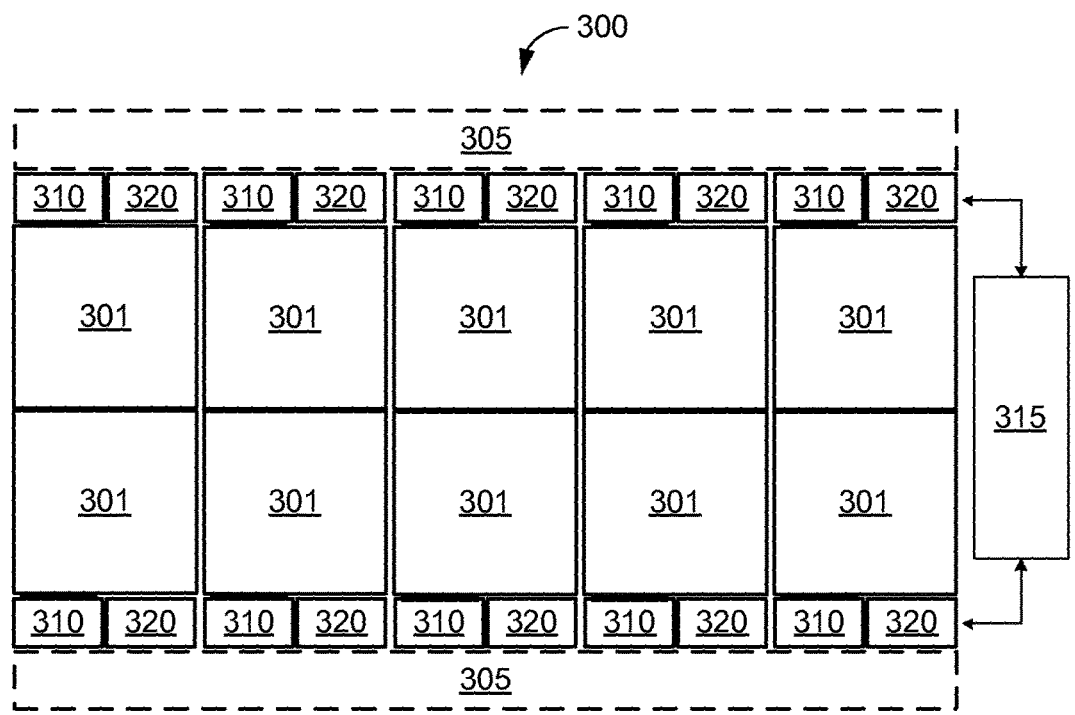
FIG. 3a shows a top view of a layout of lithography system.
Figure 3B:
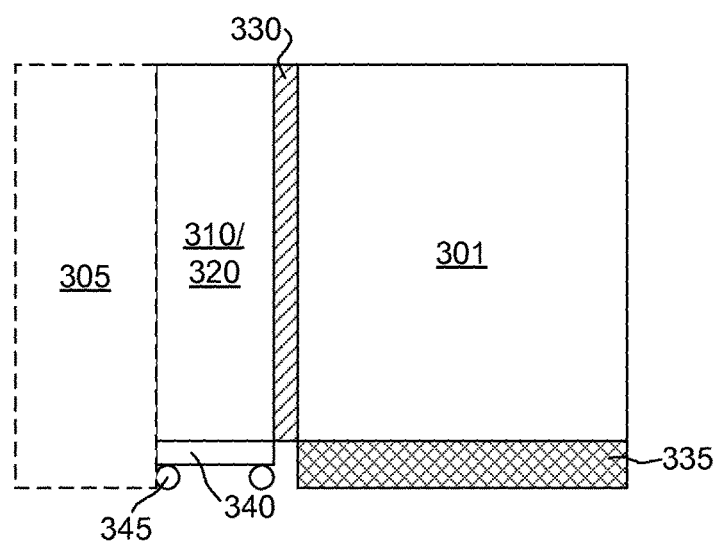

FIG. 3a shows a top view of a layout of lithography system 300 comprising a group of lithography system units according to an embodiment of the invention. Hereinafter, the layout may be referred to as lithography system 300 or cluster 300. FIG. 3b schematically shows a cross-sectional side view of a portion of the lithography system 300.

In this particular embodiment, the lithography system 300 comprises a group of ten lithography system units. The lithography system units are arranged back-to-back in two rows of five. Directly adjacent to the cluster 300, floor space is reserved as service area 305. Each lithography system unit comprises a lithography apparatus 301 that is contained in its own vacuum chamber, with one side of each vacuum chamber facing a lithography system unit in the other row, while the opposing side faces the surroundings of the cluster 300, in particular the service area 305.

In case of a charged particle lithography apparatus, the vacuum chamber preferably comprises all elements that enable lithography processing, including a charged particle source, a projector system for projecting charged particle beamlets onto a substrate to be patterned, and a moveable substrate stage. For example, the vacuum chamber may correspond to the chamber 240 discussed with reference to FIG. 2.

The side of the lithography system unit facing a free area provided for service purposes comprises a load lock system 310 for transferring substrates into and out of the vacuum chamber, and also comprises an access door 330 that can be opened for such service purposes.

The lithography system units are provided with a door 330 at the same side as the load lock system 310. The door 330 may be removably attachable, and may be removable in its entirety, for example by using a transfer unit 340. The transfer unit 340 may be arranged to support the door 330 and may comprise one or more transfer elements 345, such as wheels or rails. The lithography apparatus 301 may be supported by a supporting structure 335 for positioning the lithography apparatus at an elevated position.

The free area at the side at which the load lock system and access door are located preferably is sufficiently large to accommodate the footprint of the door and the load lock. Furthermore, it is desirable that the free area is sufficiently large to accommodate a footprint of an arrangement for carrying components of the lithography apparatus.

The lithography system 300 thus comprises a plurality of lithography system units having a load lock system 310 and a door 330 facing the surroundings, more in particular facing the service area 305 surrounding the lithography system 300. Due to the "outward" orientation of the load lock systems 310 and doors 330, the lithography system units, including the lithography apparatuses 301 within the vacuum chambers, are directly accessible from the service area 305. Direct access simplifies servicing of the lithography system 300, and may reduce the downtime of the lithography system or parts thereof. Opening a single specific vacuum chamber for servicing can be done without affecting the throughput of other lithographic system units within the lithography system 300.

The back-to-back layout of the lithography system units provides a lithography system 300 with a limited "footprint". Floor space within a fab is valuable, and efficient use of the fab floor space is thus important.

The load lock system 310 may be integrated into the door 330. Integration of the load lock system 310 and the door 330 reduces the amount of material used in manufacturing the lithography system unit. A portion of the door 330 may be directly used as one of the side walls of the load lock system 310. The material reduction has the advantage that the door and load lock system combination is easier to handle during servicing. Furthermore, as less material is needed during manufacturing, the costs of manufacturing the lithography system are reduced as well.

The lithography system 300 further comprises a substrate supply system 315. The substrate supply system 315 is arranged to receive substrates to be processed by the lithography system 300, and to provide these substrates to the lithography system units for processing. This can effectively mean that the substrate supply system 315 provides the substrates to a preparation system 320 for pre-processing purposes. After patterning, the substrate supply system 315 may collect the patterned substrates. The use of a substrate supply system 315 enables the lithography system 300 to efficiently cooperate with other equipment in the fab as it allows for a relatively easy replacement of presently used lithography systems.

Figure 3C:
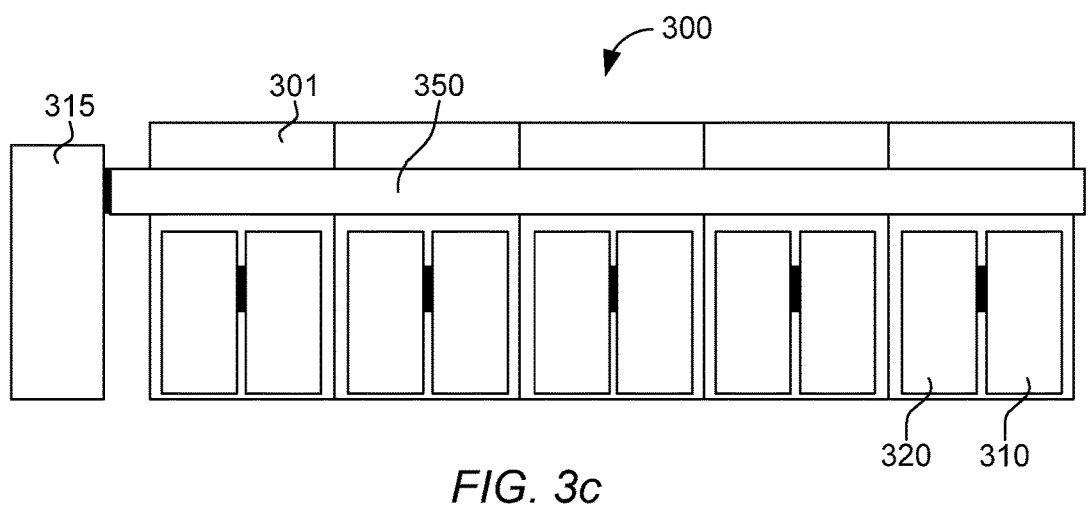

FIG. 3c schematically shows another side view of the lithography system 300 of FIG. 3a. In the shown embodiment, the lithography system 300 further comprises a substrate transfer system 350 for receiving substrates from and/or sending substrates to the substrate supply system 315. The substrate transfer system 350 may take the form of a suitable conveyor system, for example a conveyor system which extends in a substantially horizontal direction.

Preferably, the substrate transfer system 350 is designed not to interfere with the doors 330 of the lithography system units. This may be accomplished as shown in FIG. 3c. In this embodiment the substrate transfer system 350 extends in a substantially horizontal direction, and is arranged above the load lock systems 310, as well as the preparation units 320, of the lithography system units. As a result, the door of a single lithography system unit within the lithography system 300 may be opened for servicing purposes while the substrate transfer system 350 can continue with the transfer of substrates between the substrate supply system 315 and the other lithography system units within the lithography system 300.

The layout described with reference to FIGS. 3a-3c provides a cluster of lithography system units with limited complexity. The layout can be scaled rather easily. For example, if the lithography system 300 needs to operate with an 80% capacity, only eight out of the ten lithography system units need to be operational and/or installed.

Furthermore, the lithography system 300 can provide a reliable throughput. If one lithography system unit malfunctions and/or needs servicing, the other lithography system units within the cluster 300 may continue their operation. As a result, in case of 10 lithography system units with a throughput of 10 substrates, or wafers, per hour (wph), malfunctioning of one lithography system unit allows the cluster 300 to continue to work with a 90% efficiency. That is, it then operates with a throughput of 9×10 wph=90 wph instead of the ideal 100 wph. In comparison, a state of the art optical lithography apparatus may operate with a throughput of 100 wph. However, if some component within such optical lithography apparatus malfunctions, the entire apparatus needs to be shut down, reducing the throughput to 0 wph.

Before entry into the vacuum chamber, a substrate typically undergoes the actions of clamping, pre-alignment and pump down. In this context, clamping is defined as providing a substrate on a substrate support structure to form a single structure, hereafter referred to as "clamp". Furthermore, the term "clamped substrate" is used to refer to a substrate being clamped to a substrate support structure. Pre-alignment relates to aligning the substrate and/or clamp such that patterning can be performed onto a predetermined portion of the substrate in a certain orientation. Pump down relates to the step of reducing the pressure surrounding the substrate to minimize contamination and to reduce the influence of the substrate on the vacuum chamber pressure upon insertion into the lithography apparatus 301.

After the patterning action performed by the lithography apparatus 301, the substrate is typically exposed to a venting action, and an unclamping action, i.e. separating the substrate from the substrate support structure. In between the venting and unclamping actions, the substrate may be transferred.

The load lock system 310 forms an interface to a vacuum environment within the vacuum chamber. The system 310 is typically used for the pump down action and the venting action described above. For this purpose, the load lock system 310 comprises one or more chambers in which the pressure can be regulated. The load lock system 310 may comprise a single chamber suitable for both pump down and venting actions. Alternatively the system 310 comprises separate chambers for pump down and venting. For the pump down action the system 310 comprises pumps for pumping down the pressure within a chamber to a reduced pressure, e.g. a vacuum suitable for transfer of the clamped substrate and substrate support to the lithographic apparatus 301. For the venting action the load lock system 310 comprises vents for venting a chamber to increase the pressure after processing of the clamped substrate in the lithographic apparatus 301.

Clamping and/or unclamping may be performed in the preparation systems 320. Alternatively, the clamping may be performed at a different location prior to providing the substrate to the preparation systems 320, for example within the common supply system 315. In yet another alternative, clamping and/or unclamping may be performed within the load lock system 310.

Clamping and unclamping may be performed in separate units, but may also be executed in the same unit. Hereinafter the expression "clamping unit" refers to a unit for clamping and/or unclamping.

Figure 4:
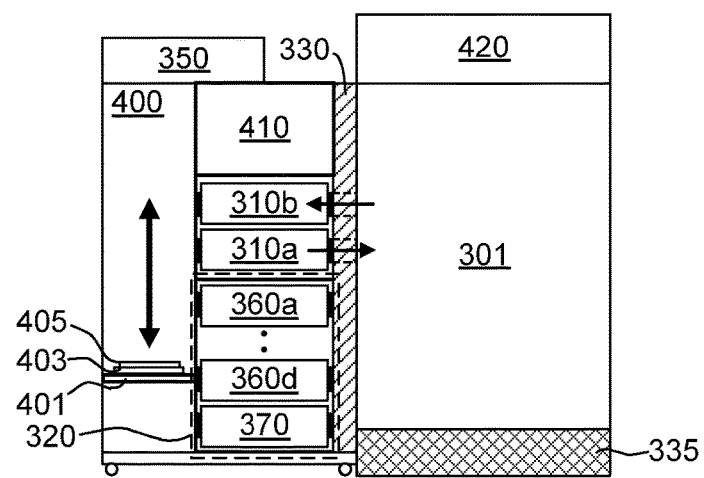
FIG. 4 schematically shows a lithography system unit within a clustered charged particle lithography system.

FIG. 4 schematically shows a lithography system unit provided with a first load lock chamber 310a for pump down, a second load lock chamber 310b for venting and a preparation system 320 that includes a number of substrate preparation units 360a-360d. In this embodiment, a clamp is formed in a suitable substrate preparation unit 360a-360d in the preparation system 320 and then inserted into the vacuum chamber via the first load lock chamber 310a. After patterning of the substrate by the lithography apparatus 301, the clamp is transferred back to a suitable substrate preparation unit 360a-d in the preparation system 320 via the second load lock chamber 310b for unclamping.

As shown in the embodiment of FIG. 4, the preparation system 320 may further include a pre-alignment unit 370 for pre-aligning the substrate before entry into the lithography apparatus 301 via the first load lock chamber 310a. Pre-alignment may be needed to ensure that the position and/or orientation of the substrate on the substrate support structure are suitable for accurate exposure within the lithography apparatus 301. After pre-alignment in the pre-alignment unit 370 the substrate is provided to the first load lock chamber 310a for further processing.

Pre-alignment may be performed on an individual substrate before the substrate is clamped. In such case the pre-alignment may be done within a substrate preparation unit 360a-360d, which would reduce the space being occupied by the lithography system unit. In case the substrate is pre-aligned in a separate pre-alignment unit 370 the substrate is preferably pre-aligned while being clamped onto a substrate support structure. Pre-alignment of the clamped substrate reduces the required accuracy at which the substrate is clamped onto the substrate support structure.

A preparation system 320 may further comprise one or more additional units. For example, the preparation system 320 may include a conditioning unit for conditioning clamped substrates and/or unclamped substrates prior to exposure in the lithography apparatus 301. The conditioning unit may be arranged for thermal conditioning of a clamped or unclamped substrate by e.g. removing heat energy from the substrate (and substrate support structure) to improve the accuracy of lithographic patterning, as is known to persons skilled in the art.

Substrates and/or clamps may be transferred between different units by using a robot that operates within a robot space 400. In the exemplary embodiment of FIG. 4 the robot comprises a carrier 401 that can move in a substantially vertical direction. Therefore, such robot will hereafter be referred to as vertical transfer robot or VTR. The carrier 401 is arranged for suitably transporting substrates and/or clamps between the load lock chambers 310a, 310b, the substrate preparation units 360a-360d, and the pre-alignment unit 370. In addition, the robot 401 may further be arranged to handle substrate exchange with the substrate transfer system 350. In FIG. 4 the carrier 401 carries a clamp comprising a substrate support structure 403 with a substrate 405 clamped thereon.

A lithography system unit may further comprise a storage unit 410 for temporarily storing substrates. The stored substrate may be substrates that still need to be patterned by the lithography apparatus 301. Alternatively or additionally, the substrate storage unit 410 may be arranged to store patterned substrates awaiting transfer via the substrate transfer system 350. In the embodiment shown in FIG. 4, the storage unit 410 is coupled to the substrate transfer system 350. Alternatively, or additionally, the storage unit 410 may be coupled to a replaceable unit and may take the form of a so-called front opening unified pod (FOUP). FOUPs enable relatively safe transfer of several substrates in one FOUP in a (clean room) environment. In yet another embodiment, the storage unit 410 is a replaceable unit, for example a FOUP.

Additionally, FIG. 4 schematically shows that electronics 420 needed to ensure proper operation of the lithography apparatus 420 may be placed on top of the lithography apparatus 301. Just like the embodiment shown in FIG. 3b, the door 330 can be removed together with the other components outside the vacuum chamber, for example by means of a transfer unit 340 comprising one or more transfer elements 345.

Although different components in FIG. 4 are shown on top of each other, alternative embodiments in which one or more of the components are positioned adjacent to each other in a substantially horizontal direction are envisioned as well. Furthermore, the order of the different components may be different.

In other embodiments of the lithography system, not shown in FIG. 4, clamping and/or unclamping is performed within the load lock system 310. Load lock systems 310 that are capable of executing these actions then need to be rather sophisticated in nature.

Clamping methods include but are not limited to clamping by using capillary forces, for example as described in US patent application 2010/0265486 assigned to the owner of the present invention and hereby incorporated by reference in its entirety. Clamping by applying a vacuum, clamping by freezing the substrate to the substrate support structure, and clamping by the use of electromagnetic forces are some of the possible alternatives. The type of clamping may depend on the type of subsequent processing to be used on the substrate.

The load lock systems 310a, 310b, as well as other units within the lithography system, for example one or more units in the preparation systems 320, such as pre-alignment units 370, clamping/unclamping units 360 and substrate storage systems 410 may comprise one or more valves for creating a controlled pressure environment. Keeping the substrates and/or clamps in a controlled pressure environment permits a reduced contamination environment to be maintained around the substrates. The controlled pressure environment may be an intermediate vacuum, between atmospheric pressure and the high vacuum of the lithography apparatus 301. This intermediate vacuum enables a reduction of contamination while avoiding having a large volume maintained at a high vacuum. In particular in case of not yet patterned substrates the intermediate vacuum aids in preparing the substrate for later processing in the vacuum environment of the lithography apparatus.

A lithography system where the clamping and/or unclamping units are provided within the lithography system units, for example within a preparation system 320 as shown in FIG. 4 or within a load lock system 310, may be identified as a clustered lithography system 300 with a localized unclamped substrate supply or "localized cluster". In a localized cluster unclamped substrates are transported to an area in close proximity of the lithography apparatus 301 in which they are to be processed. Then, the substrates are clamped on a substrate support structure, and finally the clamps, i.e. substrates clamped onto a substrate support structure, are provided to the lithography apparatus 301. Because not many components are shared between the different lithography system units, localized clusters can be scaled relatively easy, as addition and/or removal of a lithography system unit merely means that, at most, adjustments have to be made to way substrates are provided.

Figure 5:
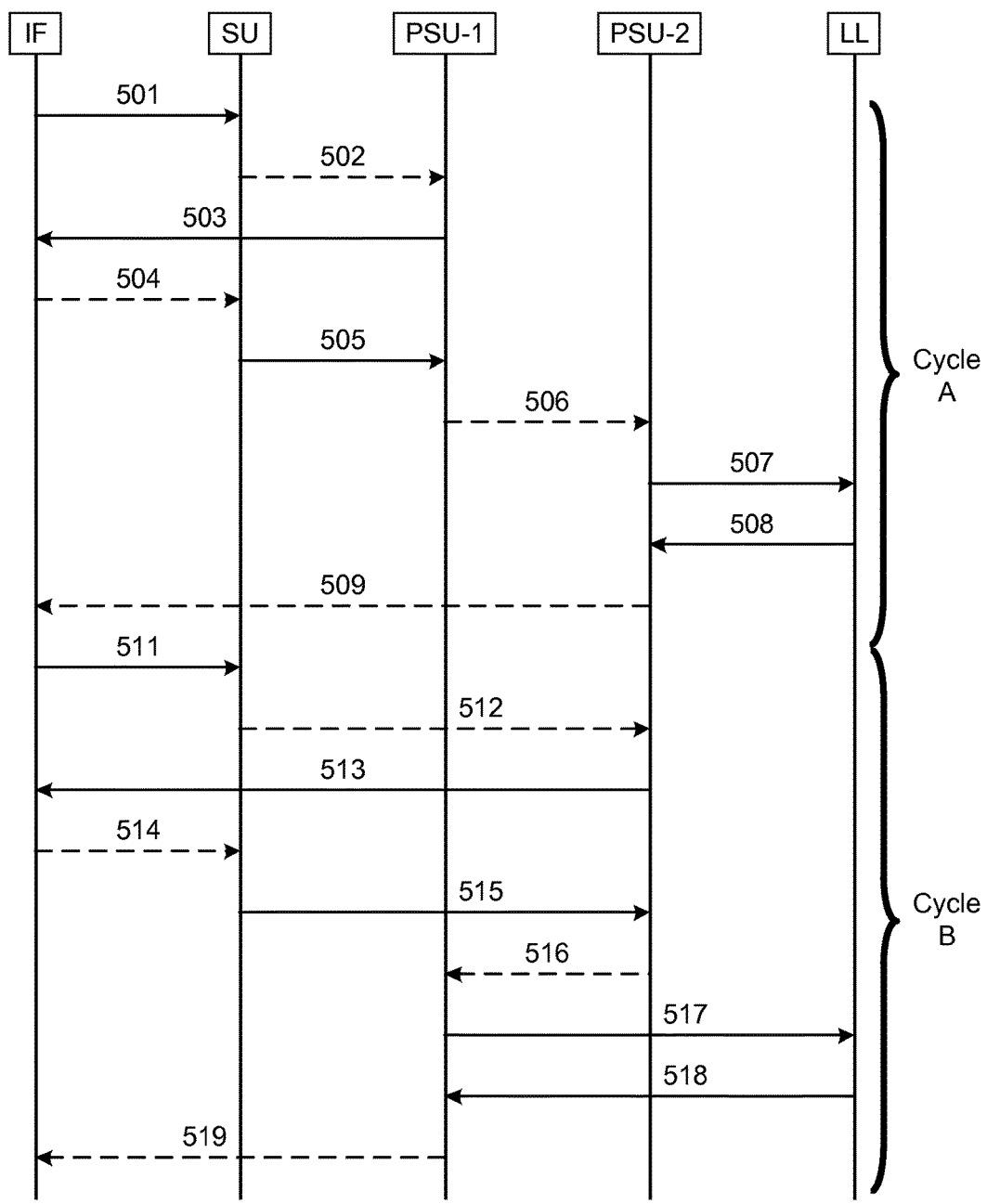
FIG. 5 schematically shows an exemplary trajectory of a substrate handling robot in a lithography system unit.

FIG. 5 schematically shows an action flow for processing a substrate in a lithography system unit. Transfer of the substrate may be accomplished using a substrate handling robot, FIG. 5 illustrating the trajectory of the robot for making the sequence of transfers. The robot may comprise and/or take the form of a carrier such as carrier 401 in FIG. 4. In FIG. 5, the interface between the substrate transfer system and the robot is denoted by "IF". Furthermore, the exemplary lithography system unit comprises a storage unit SU, a first preparation system unit PSU-1, a second preparation system unit PSU-2, and a load-lock LL coupled to a lithography apparatus.

As mentioned earlier, the interface IF may correspond to the interface between the substrate transfer system 350 and the lithography system unit described above with reference to FIG. 4. The storage unit SU may correspond to the storage unit 410 described above with reference to FIG. 4. The preparation units PSU-1 and PSU-2 may for example comprise two of the substrate preparation units 360 described above. Finally, the load lock LL may correspond to the load lock system 310 described above with reference to FIG. 4. Alternatively, the load lock LL may comprises a single load lock chamber comprising one or more carriers to enable the handling of more than one substrate in the load lock LL. Movements during which the robot actually transfers a substrate are represented by the solid arrows. Mere movements of the robot without substrate transfer are denoted by the dashed arrows.

The trajectory in FIG. 5 starts with the robot being positioned at the interface IF. The first movement involves the transfer of a new unclamped substrate to be exposed from the interface IF towards the storage unit SU for temporary storage in action 501. Note that prior to such transfer in action 501 the substrate may have been aligned in a relatively coarse manner, for example by detection of the orientation of a substrate notch or the like. After placement of the substrate in the storage unit SU, the robot moves towards the first preparation system unit PSU-1 in action 502. At preparation system unit PSU-1, the robot picks up an exposed unclamped substrate and transfers this substrate in action 503 to the interface IF to allow removal thereof from the lithography system unit. The robot then moves back in action 504 to storage unit SU to pick up the unclamped substrate for exposure placed therein at the end of action 501. In action 505, the unclamped substrate is picked up from the storage unit SU and transferred to the preparation system unit PSU-1. After placement of the unclamped substrate in the PSU-1, the robot moves in action 506 to the preparation system unit PSU-2. The robot then picks up a clamped substrate to be exposed and transfers the clamped substrate to the load lock LL for exposure in the lithography apparatus in action 507. After removal of the clamped substrate at the load lock, the robot picks up an exposed clamped substrate and transfers this substrate to preparation system unit PSU-2 for unclamping in action 508. Finally, the robot moves to the interface IF without carrying a substrate in action 509. The series of actions 501-509 is referred to as "cycle A".

The trajectory in FIG. 5 then continues at the interface IF with action 511, which is similar to action 501. However, after placement of the new unclamped substrate to be exposed, the robot does not move to preparation system unit PSU-1 as in action 502, but instead moves to preparation system unit PSU-2 in action 512. Subsequently, in action 513, the robot picks up an exposed clamped substrate present in preparation system unit PSU-2, and transfers this substrate to the interface IF to enable removal of the substrate from the lithography system unit. The robot then moves to the storage unit SU in action 514 in a similar fashion as it did in action 504. The robot then picks up an unclamped substrate to be exposed from the storage unit SU and transfers this substrate to the preparation system unit PSU-2 in action 515. After delivery of this unclamped substrate, the robot moves to the preparation system unit PSU-1 in action 516, picks up a clamped substrate to be exposed and transfers the clamped substrate to the load lock LL for exposure in the lithography apparatus in action 517. After removal of the clamped substrate at the load lock, the robot picks up an exposed clamped substrate and transfers this substrate to preparation system unit PSU-1 for unclamping in action 518. Finally, the robot moves to the interface IF without carrying a substrate in action 519. The series of actions 511-519 is referred to as "cycle B".

The robot may now repeat the trajectory of FIG. 5, which effectively means that it alternates between following cycle A and cycle B, where the difference between the two cycles is the role of the preparation system unit PSU-1 and the preparation system unit PSU-2. The trajectory shown in FIG. 5 is particularly useful to ensure a continuous flow of substrates in case the clamping action in a preparation system unit takes more time than the duration of an entire cycle.

In view of the desire to have a lithography system of limited size, the storage capacity of the components within the lithography system unit is preferably limited. In particular, PSU-1 and PSU-2 are generally only capable of facilitating the preparation of a single substrate. Similarly, the storage unit SU preferably stores a single substrate. The load lock LL is preferably capable of storing two substrates clamped onto corresponding substrate support structures. The possibility to accommodate two clamped substrates in the load lock LL enables placement of a clamped substrate in the load lock LL without the need to first remove a substrate that has been processed earlier. The load lock LL may comprise a single load lock chamber. Alternatively, the load lock LL comprises more than one load lock chamber, for example as described with reference to FIG. 4. In this multiple-chamber embodiment, each load lock chamber is preferably arranged to accommodate a single substrate clamped onto a substrate support structure.

In case only single substrates are stored in the storage unit SU, the preparation system unit PSU-1 and the preparation system unit PSU-2, the following could be said with respect to a wafer N that is processed following the trajectory as described with reference to FIG. 5. The wafer N would be transferred from the interface IF to the storage unit SU in action 501, optionally after the orientation of the wafer has been changed as a result of an alignment procedure at the interface IF. The wafer N is then transferred to the first preparation system unit PSU-1 in action 505. In case of the use of a storage unit SU with a capacity of a single wafer, the storage unit SU would thus then be empty. The wafer N is then clamped and the clamped substrate is then transferred to the load lock LL in accordance with action 517. Besides clamping, other actions may also be performed in the preparation system unit PSU-1. For example, relatively fine alignment, in particular with respect to the orientation of the wafer N with respect to the substrate support structure onto which the wafer N is to be clamped, may be executed a brief period of time prior to clamping. Via the load lock LL the wafer N is transferred into the lithography apparatus for lithographic exposure.

Within the lithography apparatus one or more further actions may be performed prior to exposure. Such actions may include one or more measurements such as alignment mark measurement, beam positioning measurement, and beam current measurement. Actions related to such measurement may include, but are not limited to movement of the wafer N to a focal plane sensor, measure global orientations in different directions such as x, y, z, Rx, Ry and Rz, scan marks around fields on the wafer N, movement of the wafer N to marks, such as knife edge alignment marks, on an alignment sensor, and movement of the wafer N to a beam positioning sensor. After exposure, the wafer N is transferred back to the load lock chamber LL and removed by the robot and transferred to a preparation system unit for unclamping corresponding to action 508 or action 518 depending on the preparation system unit that is being used. Finally, the wafer N is moved to the interface in action 509 or action 519 to enable removal of the processed wafer N from the lithography system unit by the substrate transfer system.

In the scenario described above, the wafer that is to be processed after wafer N, i.e. wafer N+1, occupies the place left open by wafer N in the storage unit SU as a result of the robot transferring wafer N+1 from the interface IF to the storage unit SU in action 511. The substrate is then moved to the preparation system unit PSU-2 in action 515. After preparation, the wafer N+1 is transferred to the load lock LL. Preferably, at this time, wafer N is also present in the load lock LL, ready to be removed from the load lock, and to be transferred to preparation system unit PSU-2 by the robot in action 508. In such scenario, wafer N would thus effectively takes the place previously occupied by wafer N+1 in the preparation system unit PSU-2.

In the scenario described above, the wafer that is processed prior to wafer N, i.e. wafer N−1, is the wafer that resides in the load lock LL when wafer N is placed therein as a result of action 517. Wafer N−1 is then removed from the load lock LL and transferred to the substrate preparation unit PSU-1 in action 518 to take the place previously occupied by wafer N.

Figure 6:
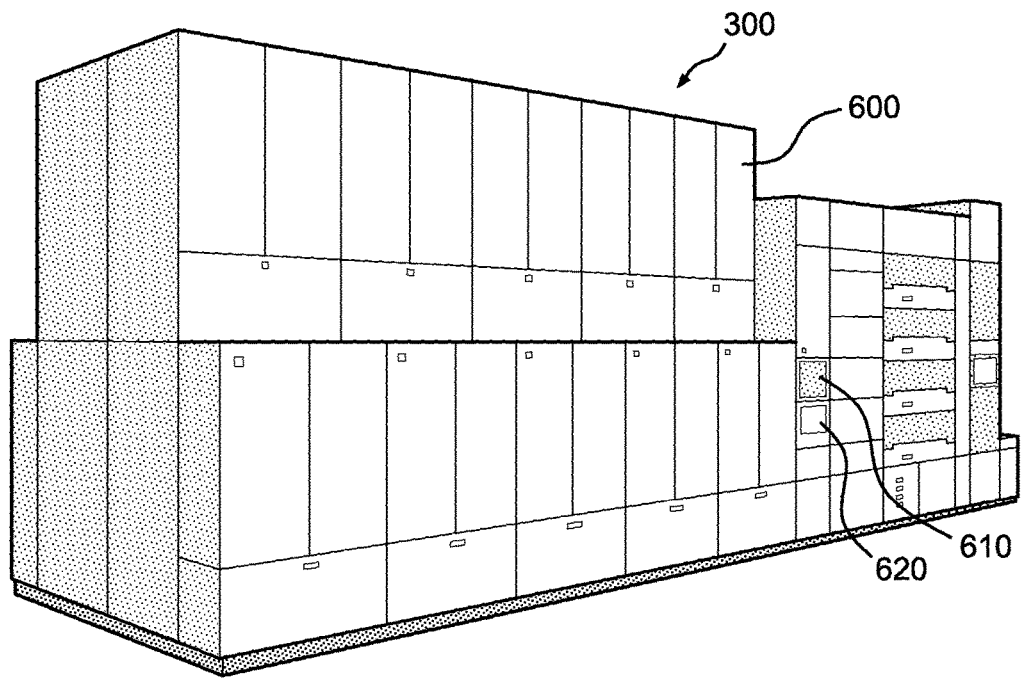
FIG. 6 shows a clustered lithography system.

FIG. 6 shows a perspective view of a lithography system 300. In such lithography system 300 all components may be protected from the outside environment by means of a suitable housing or casing 600. The housing 600 includes removable portions, or may be removable in its entirety, to facilitate maintenance, repair, and operational adjustment of components within the lithography system 300. The housing 600 may be provided with one or more interfaces that allow operators to monitor and/or adjust parameters within the lithography system 300. The interfaces may comprise a display 610 and/or a keyboard 620 for these purposes.

Figure 7:
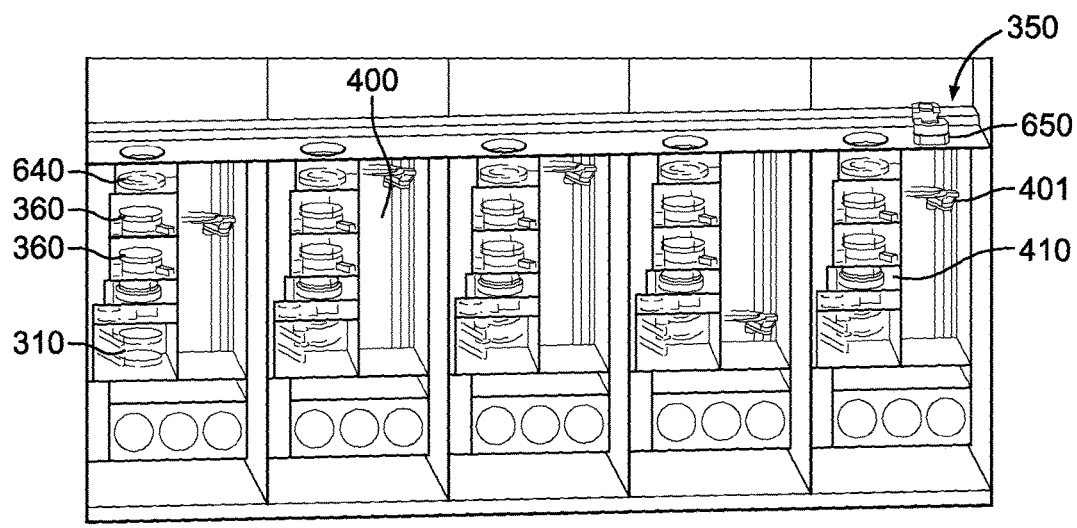
FIG. 7 shows a portion of the clustered lithography system with its cover removed.

FIG. 7 shows a portion of the clustered lithography system of FIG. 6 with a portion of its cover being removed. FIG. 7 shows elements used for transfer and preparation of substrate for five lithography system units. The substrates are provided via the substrate transfer system 350 comprising a transfer robot 650 that moves in a substantially horizontal direction, hereafter referred to as horizontal transfer robot or HTR 650. The HTR 650 is arranged to transfer substrates to be processed towards a lithography system unit and to transfer processed substrate away from a lithography system unit. An exchange of substrates between the substrate transfer system 350 and the lithography system unit is performed via an interface 640.

Each lithography system unit is further provided with at least two substrate preparation units 360, a storage unit 410 and a load lock 310 arranged for accommodation of at least two substrates or clamps. The lithography system unit further includes a carrier 401 for moving substrates and/or clamps between the different units, for example following a trajectory as discussed with reference to FIG. 5. Since the carrier 401 will move in a substantially vertical direction, hereafter the carrier may be referred to as vertical transfer robot or VTR 401.

Figure 8A:
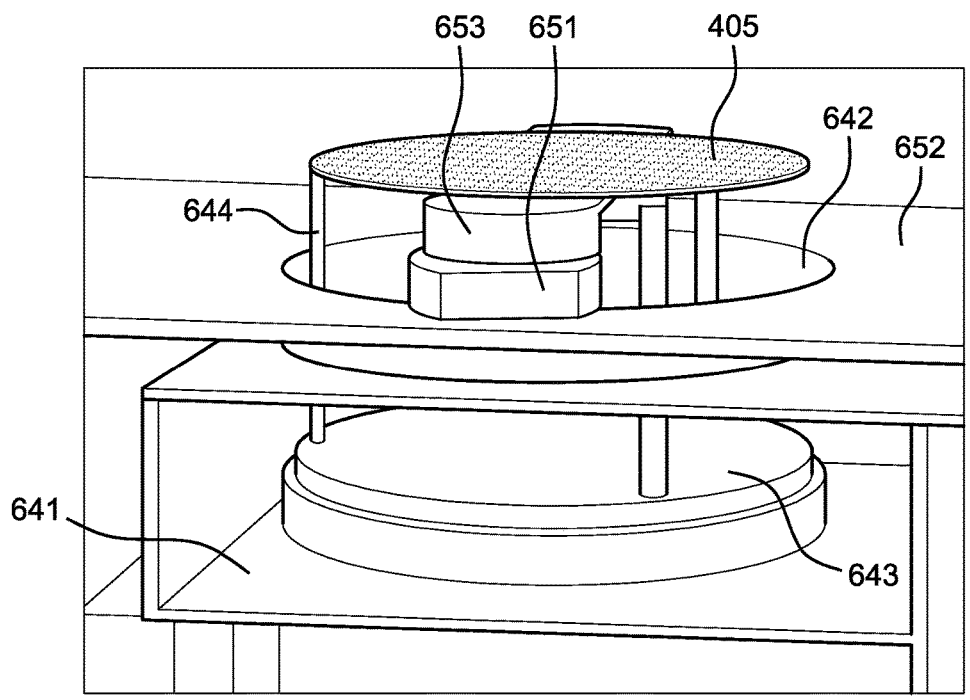
FIGS. 8a, 8b show an interface between a substrate transfer system and a preparation system at different stages of substrate transfer.
Figure 8B:
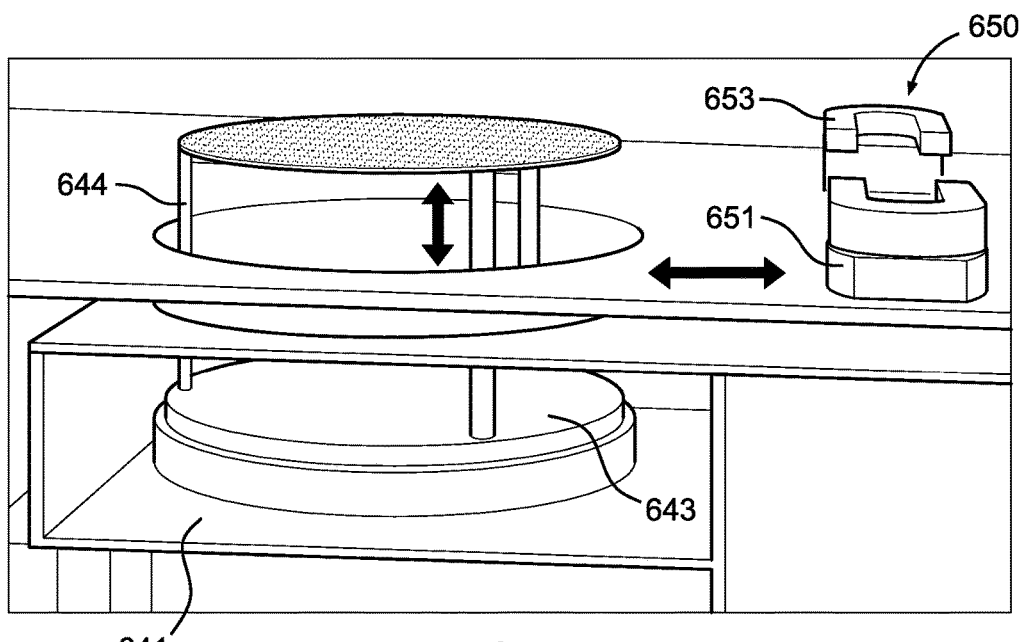

FIGS. 8a, 8b provide a more detailed view of the interface 640 between the substrate transfer system 350 and a lithography system unit at different stages of substrate transfer. The interface 640 comprises a chamber 641 provided with a top wall provided with an opening 642 that is sufficiently large to allow a substrate 405 to be transferred through the opening 642. The chamber 641 further includes a supporting surface 643 and at least three extendible pins 644. The at least three extendible pins 644 are positioned in the supporting surface 643 and can move in a substantially vertical direction. The pins 644 are placed with respect to each other in such a way that they can support a substrate 405 in a stable manner. Furthermore, the pins 644 are positioned in a way that they do not interfere with HTR 650 and VTR 401 so that these robots may transfer the substrate 405 without being hindered by the pins 644.

The HTR 650 comprises a body 651 that can move along a guiding rail 652. The body 651 is provided with two opposing support units 653 that may be provided with one or more extensions or "fingers". The two opposing support units 653 are arranged for holding the substrate 405 in a stable position. The HTR 650 is constructed in such a way that its components do not interfere with the pins 644 while being positioned at the edge of the opening 641 to enable substrate transfer between the HTR 650 and the lithography system unit.

Supply of a substrate 405 to a lithography system unit may be performed in the following way. First the HTR 650 is provided with a substrate 405 that rests on top of the supporting units 653. The HTR 650 then transfers the substrate 405 by movement of the body 651 in a substantially horizontal direction along a guiding rail 652 until the substrate 405 is positioned above the opening 461. It will be understood that the HTR 650 can take many different forms and the means of moving the HTR 650 may well be different from the way depicted in FIGS. 8a, 8b. Subsequently, the pins 644 will move upward through the hole until they engage with the substrate 405. At that point the pins 644 will move upwards somewhat further to lift the substrate 405 from the supporting units 653 of the HTR 650. The HTR 650 is then moved away from the opening 641 as depicted in FIG. 8b. Finally, the pins 644 are lowered such that the substrate 405 enters the interface chamber 461. The end position of the pins 644 is determined by the specific size and shape of the VTR 401 that is used in the lithography system unit. Removal of a substrate 405 from a lithography system unit may be performed by performing the actions described above in a reverse order.

Figure 9A:
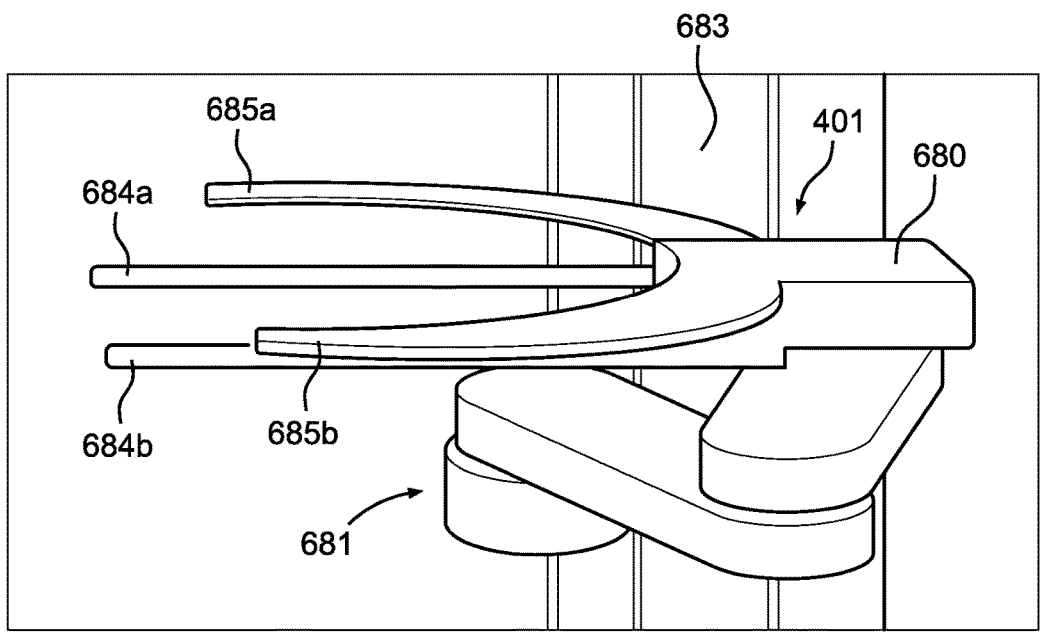
FIGS. 9a, 9b schematically show a carrier according to an embodiment of the invention.
Figure 9B:
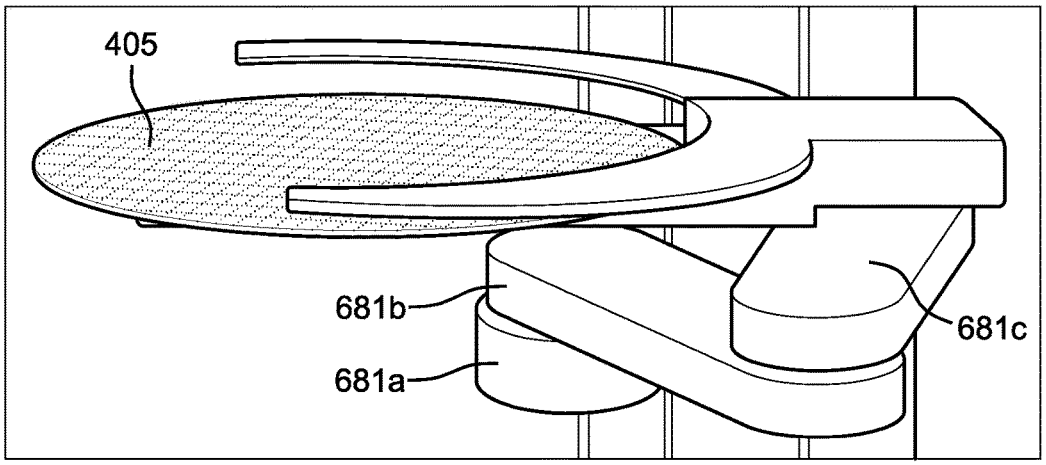

FIGS. 9a, 9b schematically show a carrier 401 according to an embodiment of the invention. The carrier 401 comprises a body 680 provided on a robot arm comprising a base 681a that can be moved along a rail 683, the rail being oriented in a substantially vertical direction. The robot arm 681 further comprises different sections 681b, 681c, which enable the arm to translate and rotate the substrate in a two-dimensional plane, typically the substantially horizontal plane. The body 680 is provided with at least two extended portions or fingers 684a, 684b for carrying a substrate 405. Additionally, the body 680 is provided with at least two further extended portions or fingers 685a, 685b for carrying a substrate support structure 403 onto which a substrate 405 may be clamped. Preferably, the fingers 684a, 684b for carrying a substrate 403 are positioned at a level below the fingers 685a, 685b. Preferably, the difference in height exceeds the thickness of the substrate support structure 403 to ensure that the fingers 684a, 684b do not hamper the carrying performance of the fingers 685a, 695b. In an optimal design, the fingers 684a, 684b may provide additional support in case a clamp is being transferred by the carrier 401.

The fingers 684a, 684b preferably extend in a single direction, i.e. they take the form of straight bars. Most preferably, the fingers 684a, 684b extend in directions substantially parallel to each other. The fingers 685a, 685b preferably have an arched or crescent shape, the ends of the fingers 685a, 685b opposing each other. Both the fingers 684a, 684b and 685a, 685b have a length that is sufficiently long to extend underneath more than halfway the structure they are designed to support. In case of a circular shape, such length should thus exceed the radius of the structure to be carried.

Figure 10:
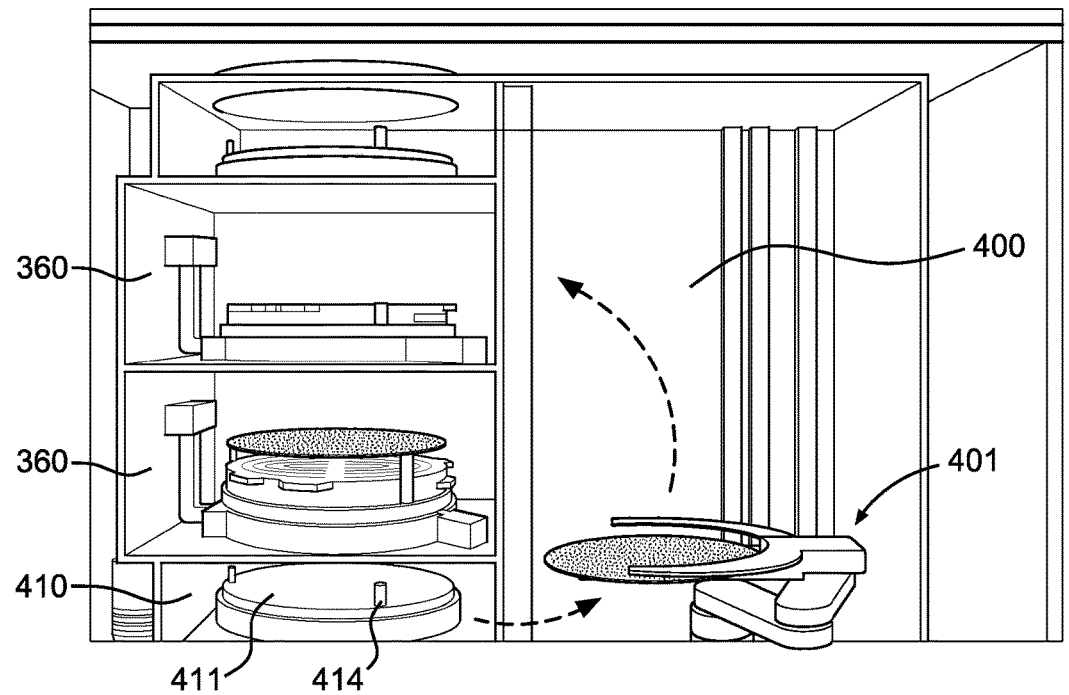
FIG. 10 schematically shows a clamped substrate handling unit for use in a load lock system.

The VTR 401 takes the substrate from the interface chamber 641 as discussed with reference to FIGS. 8a, 8b and transfers the substrate 405 to a substrate preparation unit 360 or storage unit 410. In the latter case, as depicted in FIG. 10 by means of the dashed arrow, the VTR 401 transfers the substrate 405 from the substrate unit 410 to the substrate preparation unit 360 to enable clamping onto a substrate support structure and to perform other suitable preparation actions. The storage unit 410 comprises a supporting surface 411 and may include pins 414 that may be extended in a substantially vertical direction. In case of insertion or removal of a substrate the pins 414 are suitably extended to allow the fingers 684a, 684b that support the substrate 405 to slide past at least some of the pins 414 at a height lower than the pin ends. When the fingers 684a, 684b are in the correct position, i.e. prior to insertion such that the substrate 405 supported by the fingers 684a, 684b is suitably placed above the pins 414, and prior to removal such that the fingers 648a, 684b are suitably placed underneath the substrate 405 supported by the pins 414, the pins 414 move to allow transfer from the substrate 405 between the pins 414 and the fingers 684a, 684b.

In case of insertion, the pins 414 then move upwards until they are in sufficient contact with the substrate 405. At that stage, either the pins 414 move upwards somewhat further or the VTR 401 is moved downwards to separate the substrate 405 from the VTR 401, and allow the support of the substrate 405 to be entirely taken over by the pins 414. After sufficient separation, the VTR 401 is retracted out of the storage unit 410.

In case of substrate removal, the pins 414 move downwards until the fingers 684a, 684b of the VTR 401 are in sufficient contact with the substrate 405. At that stage, either the VTR moves upwards or the pins 414 are moved downwards to separate the substrate 405 from the pins 414 and allow the support of the substrate 405 to be entirely taken over by the VTR 401. After sufficient separation, the VTR 401 is retracted out of the storage unit 410.

Figure 11:
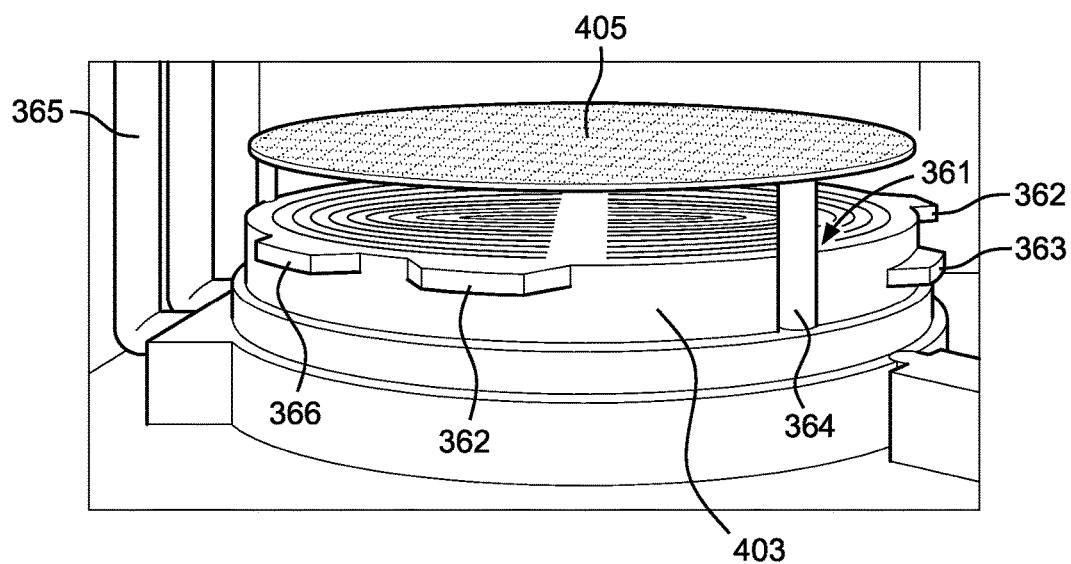
FIG. 11 shows a substrate preparation unit for placement of a substrate support structure onto which a substrate is to be clamped.

FIG. 11 shows a substrate preparation unit 360 in which a substrate support structure 403 is placed onto which a substrate 405 is to be clamped. The substrate is supported on pins 364 that operate in a similar way as pins 414 discussed with reference to FIG. 10. Preferably, the substrate support structure 403 is provided with notches 361 that enable accommodation of the pins 364 within the substantially circular circumference of the substrate support structure 403 that would have been formed if such notches 361 would have been absent. The use of notches 361 limits the space that is occupied by the combination of substrate support structure 403 and pins 364. Furthermore, by allowing the pins 364 to extend through the notches 361 the substrate 405, when clamped onto the substrate support structure 403, is in contact with the support structure 403 over a larger area which may improve the clamping quality. Finally, the use of notches in the substrate support structure may enable some form of coarse pre-alignment.

Clamping methods include but are not limited to clamping by using capillary forces, for example as described in US patent application 2010/0265486 assigned to the owner of the present invention and hereby incorporated by reference in its entirety. Clamping by applying a vacuum, clamping by freezing the substrate 405 to the substrate support structure 403, and clamping by the use of electromagnetic forces are some of the possible alternatives. The type of clamping may depend on the type of subsequent processing to be used on the substrate 405. The supply of fluids, for example in case of clamping by using capillary forces, or removal of air, for example in case of clamping by applying a vacuum, may be executed via one or more tubes 365. The surface of the substrate support structure 403 for receiving the substrate 405 may be provided with a pattern of grooves and/or other elevated structures such as burls, to enhance the clamping process.

The substrate support structure 403 is further provided with a number of protrusions or lips 362. These lips 362 are positioned along the circumference of the substrate support structure 403. The lips 362 are used to engage with the fingers 685a, 685b of the VTR 401. In FIG. 11, the lips 362 are located at a height level that is close to the surface of the substrate support structure 403 onto which the substrate 405 is to be clamped. To enhance the stability during transfer the lips 362 are preferably located above the center of mass of the substrate support structure 403, and preferably also above the center of mass of the combination of a substrate support structure 403 and a substrate 405 clamped thereon. In some embodiments, another lip 362 may be used to engage with the body 680 of the VTR 401.

In some embodiments, such as the embodiment shown in FIG. 11, the substrate support structure 403 is provided with further protrusions or lips 363, 366. The at least two lips 366 (only one lip is depicted in FIG. 11) are provided at the same height level as the lips 362. The lip 633 is provided at a lower height level. In the embodiment discussed hereafter, these lips 363, 366 are used by a handling robot in the load lock system 310.

Preferably, the lips 362 used to engage with the VTR fingers 685a, 685b are located along one side of the substrate support structure 403, that side being the side facing away from the VTR body 680. Such arrangement reduces the risk of tilt or tipping over during transfer.

In embodiments using the at least two lips 366 and at least one lip 363, the at least two lips 366 are preferably located between the lips 362 used to engage with the VTR fingers 685a, 685b. The at least one lip 363 is located at the side facing the VTR body 680.

Figure 12:
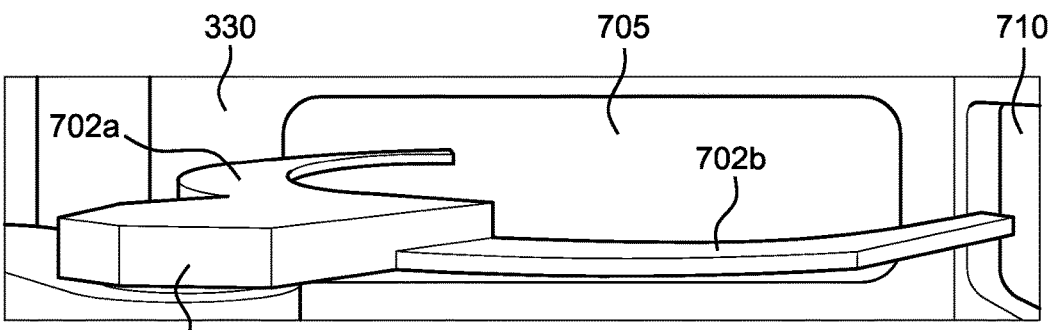
FIG. 12 schematically shows a clamped substrate handling robot for use in a load lock system.

FIG. 12 schematically shows a clamped substrate handling robot for use in a load lock system 310. The handling robot receives clamped substrates to be processed from the VTR 401 via passage 710 and transfers the clamped substrate towards the lithography apparatus via passage 705 in door 330. Similarly, the handling robot receives processed clamped substrates from the lithography apparatus via passage 705 and hands over the substrate to the VTR 401 entering via passage 710.

The handling robot comprises a body 701 provided on a robot arm. The body 701 is provided with at least two extended portions or fingers 702a, 702b for carrying a substrate support structure 403 onto which a substrate 405 is clamped. Preferably, the fingers 702a, 702b have an arched or crescent shape, and have a length that is sufficiently long to extend underneath more than halfway the structure they are designed to support. The finger 702a has a different, i.e. higher, height level than the finger 702b. The reason for this difference in height level will be discussed with reference to FIG. 13b.

Figure 13A:
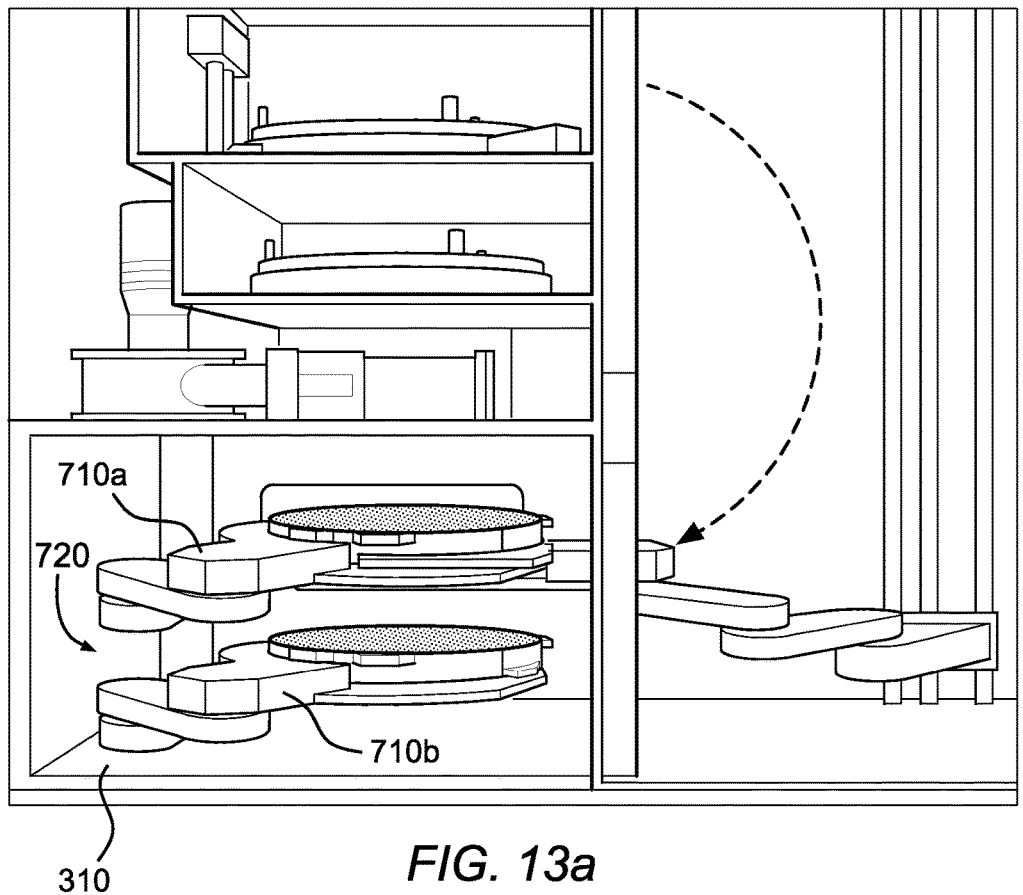
FIG. 13a shows the transfer of a clamped substrate from a substrate preparation unit towards a load lock system.

FIG. 13a shows the transfer of the clamped substrate from the substrate preparation unit 360 towards the load lock system 310. The load lock system 310 comprises a clamped substrate handling robot comprising a robot arm 720 onto which two handling bodies 701a, 701b are attached above each other.

Figure 13B:
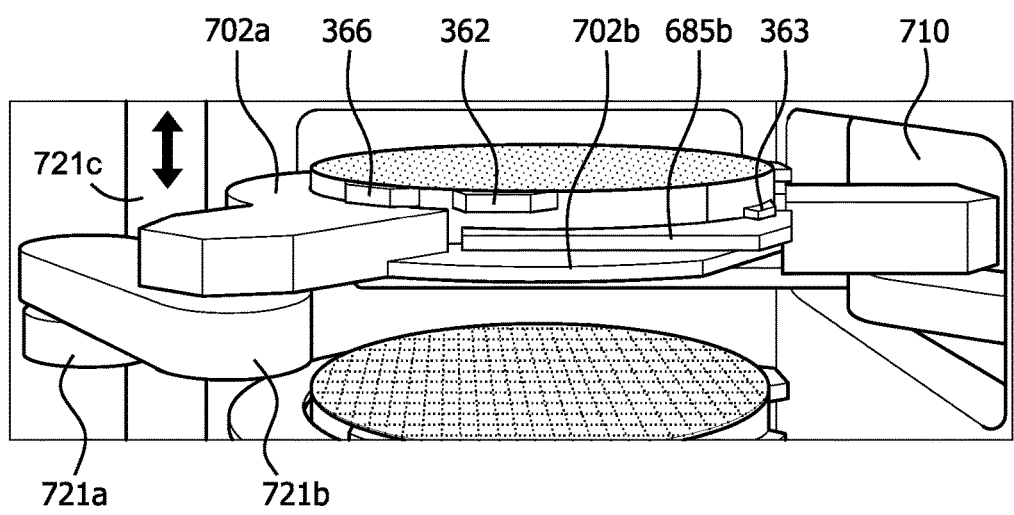

FIG. 13b shows a more detailed view of the load lock system 310 at a time just after delivery of the clamped substrate to the upper handling body 701a. In FIG. 13b, merely a portion of the robot arm 720 is shown, i.e. the portion that relates to the upper handling body 701a. The robot arm 720 comprises a base 721a that can be moved along a rail 721c, the rail 721c being oriented in a substantially vertical direction. The robot arm 720 further comprises different sections 721b, connected to the base 721a and the body 701a, that enables the arm to translate and rotate the clamp that is being held by the fingers 702a, 702b in a two-dimensional plane.

In the embodiment shown in FIG. 13b, the substrate support structure 403 is provided with lips 362 have been used to engage with the VTR fingers 685a, 685b located along a side of the substrate support structure 403 facing away from the VTR body 680 (the left side in FIG. 13b). Furthermore, an additional lip 362 located on the other side of the substrate support structure 403 have been used to engage with the VTR body 680. Furthermore, two lips 366 (only one shown) are used to engage with the upper finger 702a extending from the upper body 701a of the handling robot and the lip 363 is used to engage with the lower finger 702b extending from the upper body 701a of the handling robot such that the upper body 701a is able to independently carry the substrate support structure 403. The position of the fingers 702a, 702b (one high, one low) in combination with the different orientation of the two sets of fingers 702a, 702b, and 685a, 685b with respect to each other (i.e. at an angle) allows both sets of fingers to hold the substrate support structure simultaneously without interfering with each other. As a result, if one of the sets of fingers is retracted, the substrate support structure 403 will be held by the other set of fingers. The design of the respective handling robots, i.e. VTR 401 and clamped substrate handling robot in load lock system 310, makes it possible to hand over a substrate support structure 403 in a direct way. Such handover reduces the space that is needed for substrate support structure transfer, which helps to keep the size of the lithography system unit as small as possible.

Figure 14A:
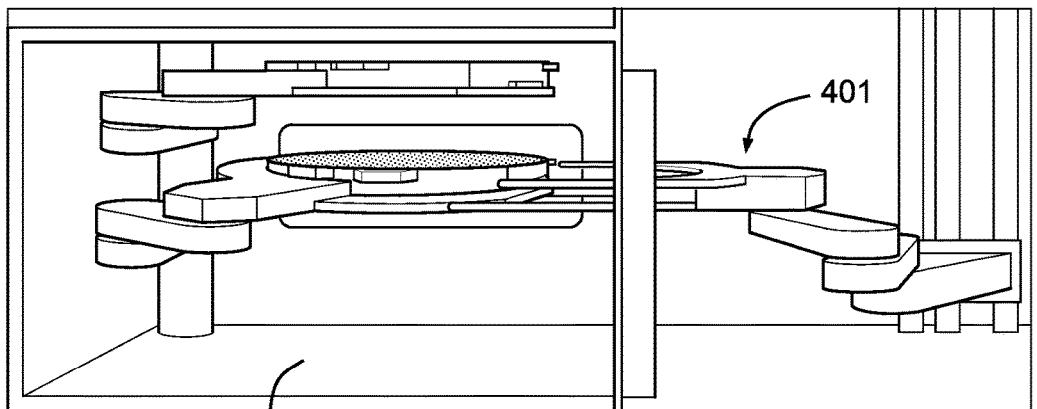
FIGS. 14a, 14b schematically show the transfer of a processed clamped substrate from the load lock system towards a substrate preparation unit.
Figure 14B:
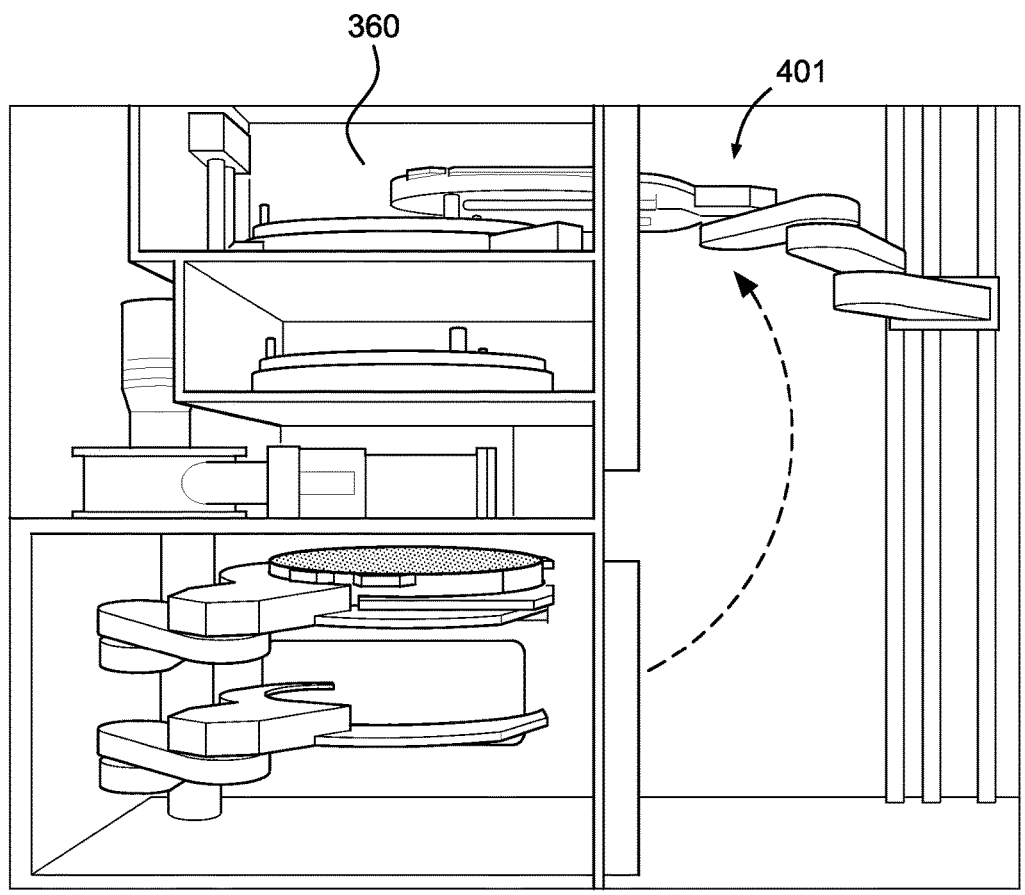

FIGS. 14a, 14b schematically show the transfer of a processed clamped substrate from the load lock system 310 towards a substrate preparation unit 360 by means of the VTR 401 (see dashed line). In FIG. 14a, the VTR 401 picks up the clamped substrate after handover with the lower handling body 701b of the handling robot. In FIG. 14b, the VTR 401 places the clamped substrate in the substrate preparation unit 360 for unclamping.

Figure 15A:
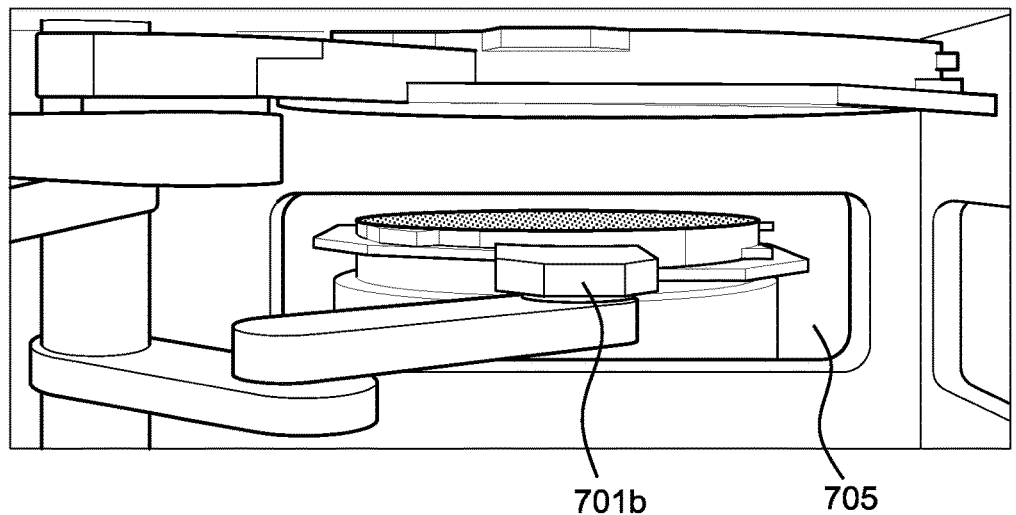
FIGS. 15a, 15b show two different stages of a replacement of clamped substrates within a load lock system.
Figure 15B:
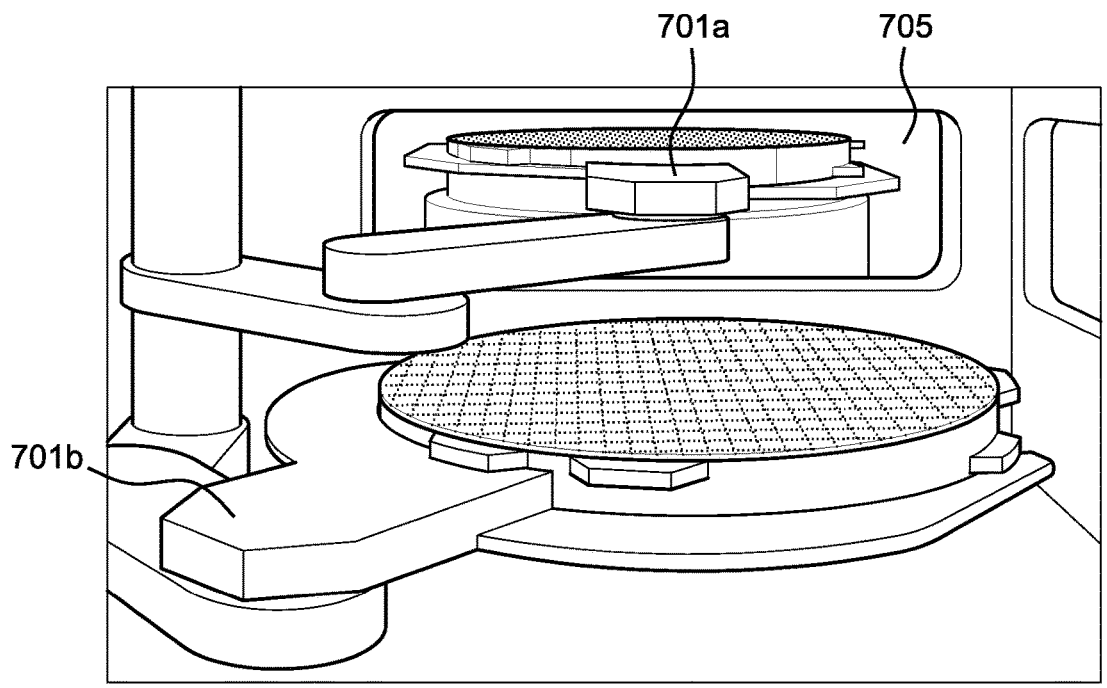

The empty space left in the load lock system 310 may now be occupied by a processed clamp that is received from the lithography apparatus as shown in FIG. 15a. The clamped substrate to be processed that was recently put in (see FIG. 13b), may then be inserted into the lithography apparatus for processing as shown in FIG. 15b.

Alternatively, the clamped substrate to be processed (held by upper body 701a) is entered into the lithography apparatus after removal of the processed clamped substrate. In such case, the lower body 701b may not hold any clamped substrate until a new clamped substrate to be processed is provided by the VTR 401 or until the clamped substrate recently put in the lithography apparatus has been processed.

Although some embodiments of the invention have been described with reference to a lithography system comprising ten lithography system units, the number of lithography system units within a lithography system may vary. For example, instead of ten lithography system units, any other number of lithography system units above one may be used.

The invention has been described by reference to certain embodiments discussed above. It will be recognized that these embodiments are susceptible to various modifications and alternative forms well known to those of skill in the art without departing from the spirit and scope of the invention.

Accordingly, although specific embodiments have been described, these are examples only and are not limiting upon the scope of the invention, which is defined in the accompanying claims.

The invention claimed is:

1. An apparatus for transferring a target from a substrate transfer system to a vacuum chamber of a lithography system, the target comprising a substrate or a substrate support structure onto which a substrate has been clamped, the apparatus comprising:
   a load lock chamber for transferring the target into and out of the vacuum chamber of the lithography system, the load lock chamber comprising a first wall having a first passage therein providing access between a robot space and the interior of the load lock chamber, and a second wall having a second passage therein providing access between the interior of the load lock chamber and the vacuum chamber of the lithography system; and
   a plurality of handling robots for transferring the targets, wherein the plurality of handling robots comprises:
      a first handling robot movable within the robot space to access the substrate transfer system and the first passage of the load lock chamber; and
      a second handling robot movable within the load lock chamber to access the first passage of the load lock chamber and the second passage of the load lock chamber for access to the vacuum chamber of the lithography system.

2. The apparatus of claim 1, wherein the moveable body of the first handling robot is adapted for controllable vertical movement within the robot space to access the substrate transfer system and the first passage of the load lock chamber.

3. The apparatus of claim 2, wherein the substrate transfer system is arranged to supply the target at a position above the position of the first passage of the load lock chamber.

4. The apparatus of claim 1, wherein the moveable body of the second handling robot is adapted for controllable horizontal movement within the load lock chamber to access the first passage of the load lock chamber and the second passage of the vacuum chamber of the lithography system.

5. The apparatus of claim 4, wherein the moveable body of the second handling robot is also adapted for controllable vertical movement within the load lock chamber.

6. The apparatus of claim 1, further comprising a third handling robot movable within the load lock chamber to access the first passage of the load lock chamber and the second passage of the vacuum chamber of the lithography system.

7. The apparatus of claim 1, wherein the first wall and the second wall of the load lock chamber are adjacent walls arranged at a substantially right angle.

8. The apparatus of claim 1, wherein each of the handling robots comprises a moveable body provided with a plurality of extended portions adapted for carrying either an unclamped substrate or a substrate clamped to a support structure, the moveable body being controllably moveable in vertical and horizontal directions.

9. The apparatus of claim 1, wherein the second handling robot is arranged to receive a processed target from the vacuum chamber via the second passage of the load lock chamber and transfer the processed target to the first passage of the load lock chamber.

10. The apparatus of claim 9, wherein the target is a clamped substrate.

11. The apparatus of claim 1, wherein the second handling robot is arranged to receive the clamped substrate, e.g. from the first handling robot, via the first passage while predominantly oriented along an angle bisection between the first wall and the second wall.

12. The apparatus of claim 11, wherein the second handling robot comprises a body provided on a robot arm, wherein the body is provided with at least two fingers for carrying a substrate support structure onto which a substrate has been clamped, and wherein the second handling robot is arranged to receive the clamped substrate, e.g. from the first handling robot, via the first passage while the fingers of the body are predominantly oriented along an angle bisection between the first wall and the second wall.

13. The apparatus of claim 12, wherein the fingers have an arched shape.

14. The apparatus of claim 12, wherein the second handling robot comprises:
   a base for said robot arm, movably arranged along a rail, wherein the rail is oriented in a substantially vertical direction; and
   a section connected to the base and the body enabling the robot arm to translate and rotate the substrate support structures onto which the substrates have been clamped in a two-dimensional plane.

15. The apparatus of claim 14, wherein the second handling robot comprises said arm articulated relative to said base, and said body articulated relative to said arm.

16. The apparatus of claim 15, wherein the second handling robot comprises said base in a vertically moveable and otherwise fixed manner.

17. The apparatus of claim 14, wherein the second handling robot comprises two bodies each movably arranged to the rail via the respective section and base.

18. The apparatus of claim 17, wherein said two bodies are simultaneously vertically moveable.

19. The apparatus according to claim 1, wherein the second handling robot is arranged to perform a sequence of:
   receiving a clamped substrate via the first passage while the second passage is closed;
   receiving a processed clamped substrate from the vacuum chamber via the second passage while the first passage is closed;
   transferring the clamped substrate towards the vacuum chamber via the second passage while the first passage is closed; and
   in any order: transferring the processed clamped substrate to the first passage and receiving a further clamped substrate via the first passage while the second passage is closed.

20. A lithography system comprising an apparatus for transferring a target from a substrate transfer system to a vacuum chamber of the lithography system, the target comprising a substrate or a substrate support structure onto which a substrate has been clamped, wherein the apparatus comprises:
   a load lock chamber for transferring the target into and out of the vacuum chamber of the lithography system, the load lock chamber comprising a first wall having a first passage therein providing access between a robot space and the interior of the load lock chamber, and a second wall having a second passage therein providing access between the interior of the load lock chamber and the vacuum chamber of the lithography system; and
   a plurality of handling robots for transferring the targets, wherein the plurality of handling robots comprises:
      a first handling robot movable within the robot space to access the substrate transfer system and the first passage of the load lock chamber; and a second handling robot movable within the load lock chamber to access the first passage of the load lock chamber and the second passage of the load lock chamber for access to the vacuum chamber of the lithography system.

21. A method for transferring a target from a substrate transfer system to a vacuum chamber of a lithography system, the target comprising a substrate or a substrate support structure onto which a substrate has been clamped, the method comprising:

a load lock chamber transferring the target into and out of the vacuum chamber of the lithography system, wherein the load lock chamber comprises a first wall having a first passage therein providing access between a robot space and the interior of the load lock chamber, and a second wall having a second passage therein providing access between the interior of the load lock chamber and the vacuum chamber of the lithography system;

a plurality of handling robots transferring the targets, wherein the plurality of handling robots comprises:

a first handling robot movable within the robot space to access the substrate transfer system and the first passage of the load lock chamber; and a second handling robot movable within the load lock chamber to access the first passage of the load lock chamber and the second passage of the load lock chamber for access to the vacuum chamber of the lithography system.

22. The method of claim 21, wherein target is a clamped substrate and wherein the second handling robot performs a sequence of:

receiving the clamped substrate via the first passage while the second passage is closed;

receiving a processed clamped substrate from the vacuum chamber via the second passage while the first passage is closed;

transferring the clamped substrate towards the vacuum chamber via the second passage while the first passage is closed; and in any order: transferring the processed clamped substrate to the first passage and receiving a further clamped substrate via the first passage while the second passage is closed.

* * * * *